(12) United States Patent
Sugibayashi

(10) Patent No.: US 6,205,065 B1
(45) Date of Patent: Mar. 20, 2001

(54) SEMICONDUCTOR MEMORY DEVICE HAVING REDUNDANCY MEMORY CIRCUIT

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,460

(22) Filed: Jan. 27, 2000

(30) Foreign Application Priority Data

Jan. 26, 1999 (JP) .................................................. 11-017640

(51) Int. Cl.⁷ .................................................... G11C 29/00
(52) U.S. Cl. ................ 365/200; 365/189.02; 365/230.02
(58) Field of Search ..................................... 365/200, 201, 365/230.06, 189.07, 230.02, 189.02

(56) References Cited

U.S. PATENT DOCUMENTS

| | | | |
|---|---|---|---|
| 5,416,740 | * 5/1995 | Fujita et al. | 365/200 |
| 5,438,573 | 8/1995 | Mangan et al. | 371/10.3 |
| 6,091,650 | 7/2000 | Ferrant | 365/200 |

FOREIGN PATENT DOCUMENTS

| | | |
|---|---|---|
| 392895 | 10/1990 | (EP) . |
| 590809 | 4/1994 | (EP) . |
| 2779251 | 12/1999 | (FR) . |
| 62-250599 | 10/1987 | (JP) . |
| 4-236199 | 9/1992 | (JP) . |

OTHER PUBLICATIONS

K. Amanuma et al., "Capacitor on Metal/Via stacked Plug (CMVP) Memory Cell for . . . FeRAM", Int. Electron Device Metting (IEDM) Tech. Digest, 1998, pp. 363–366.

* cited by examiner

Primary Examiner—Tan T. Nguyen
(74) Attorney, Agent, or Firm—Foley & Lardner

(57) ABSTRACT

A semiconductor memory device has: a memory cell array for relief 201 which stores tag (TAG) information written from a nonvolatile memory 200 for identifying defective bit cells in the basic memory 110, 110b and provides a plurality of memory cells (data) for replacing the defective bit cells in bits; an address converter 203 for allocating external addresses to an index portion and a tag portion; a decoder 202 for decoding the index portion and outputting a word line signal to the memory cell array 201; a comparator 204 for comparing the allocated tag portion with the tag information inside the memory cell array 201 specified by an output word line signal of the decoder 202; and a selector 205 for selecting and connecting either of memory cells in the basic memory 110, 110b and memory cells in the memory cell array 201 with the outside on the basis of a hit flag outputted from the comparator 204.

18 Claims, 23 Drawing Sheets

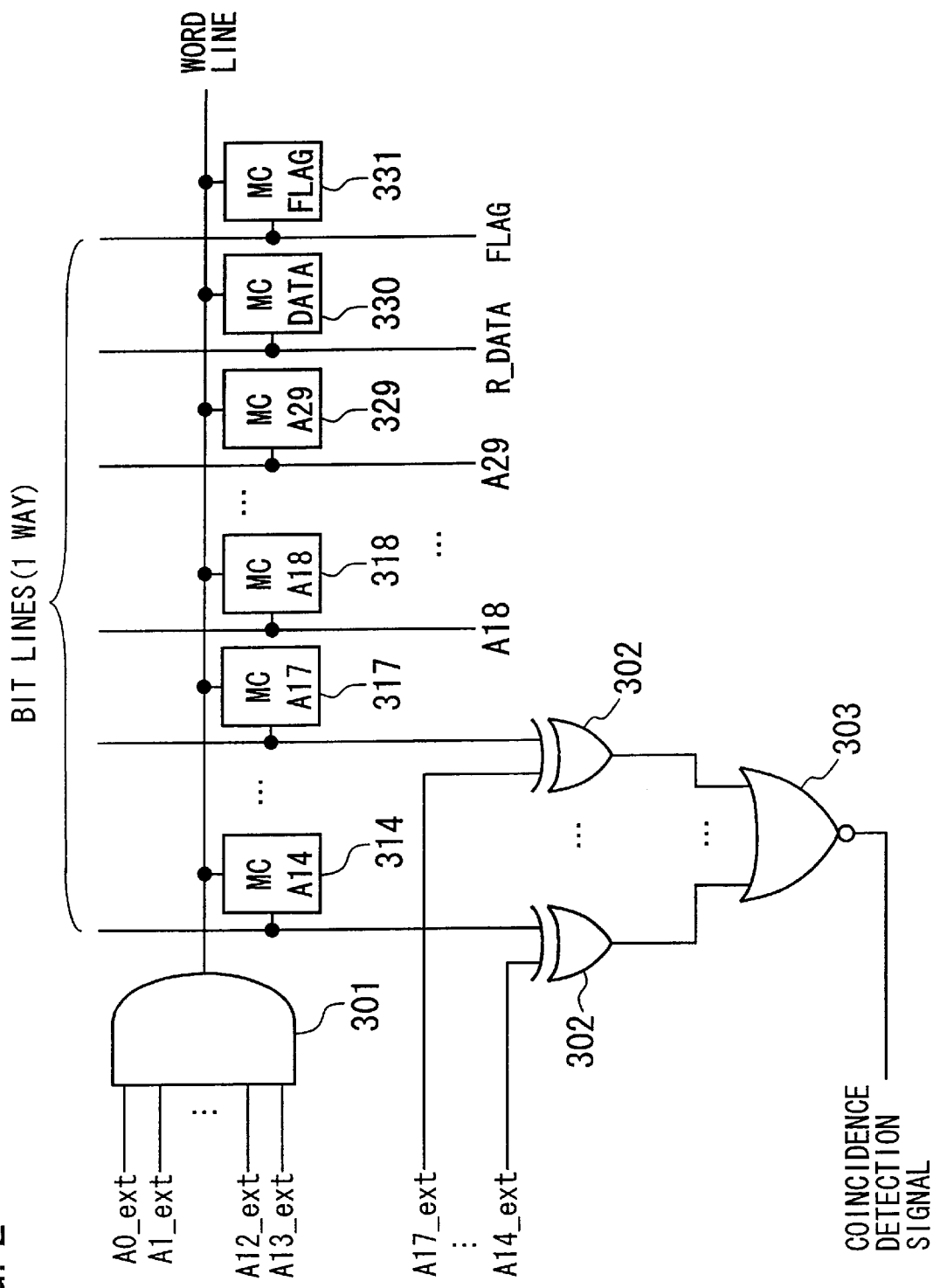

|   | 0 | 1 | 2 | 3 |
|---|---|---|---|---|
| 0 |   |   |   | × |
| 1 | × | ×▲ |   |   |
| 2 |   |   |   |   |
| 3 |   |   | × |   |

FIG. 16

|   | 0 | 1 | 2 | 3 |
|---|---|---|---|---|
| 0 |   |   |   |   |
| 1 |   | ▲ | × |   |
| 2 |   |   |   | × |
| 3 | × | × |   |   |

```
0 0 0 0     DQ0, USED
0 0 0 1     DQ1, USED
0 0 1 0     DQ2, USED
0 0 1 1     DQ3, USED
0 1 0 0     DQ4, USED
0 1 0 1     DQ5, USED
0 1 1 0     DQ6, USED
0 1 1 1     DQ7, USED
1 0 0 0     DQ8, USED
1 0 0 1     DQ8, USED
1 0 1 0     DQ8, USED
1 0 1 1     DQ8, USED
1 1 0 0     UNUSED
1 1 0 1     UNUSED
1 1 1 0     UNUSED
1 1 1 1     UNUSED
```

PRIOR ART

PRIOR ART

PRIOR ART

SEMICONDUCTOR MEMORY DEVICE HAVING REDUNDANCY MEMORY CIRCUIT

FIELD OF THE INVENTION

The present invention relates to a semiconductor memory device, and more particularly to a semiconductor memory device having a redundancy memory circuit. The present invention also relates to a method of selling such semiconductor memory device.

BACKGROUND OF THE INVENTION

Up to now, there has been a technique for relieving a memory chip having a small number of defective bit cells by replacing these defective bit cells with spare memory cells. In such a technique, for example, as shown in FIG. 23, in order to relieve a defective cell 501 indicated by "x" in a memory body or a basic memory 500, the whole word line 502 containing the defective cell is replaced with a redundancy word line 503. In this technique, however, there has been a problem that, since the whole of one row in a memory chip is replaced, in case defective cells 501 and 504 exist dispersedly as shown for example in FIG. 23, it is impossible to efficiently utilize spare memory cells.

In contrast with such a technique as described above, there is a semiconductor memory device formed so as to avoid waste of spare memory cells by utilizing an associative memory (see FIG. 24). When an associative memory 505 is used, a defective address and its data are stored in the associative memory 505 and the data portion is selected on the basis of the content of the address portion. FIG. 25 is a block diagram showing an example of a general structure of a conventional semiconductor memory device which uses an associative memory as shown in FIG. 24. A semiconductor memory device 506 shown in FIG. 25 uses a selector 507 and connects data selectively between an external data bus and a memory body 500 or a redundancy group 509, in a memory group 508, according to a result of referring to the address portion of the associative memory 505 based on the content of an external address bus. By the changeover of this selector 507, it is possible to replace defective cells. A conventional semiconductor memory device using such an associative memory is disclosed, for example, in Japanese Patent Laid-Open Publication No. 62-250599 "Semiconductor Memory Device", Japanese Patent Laid-Open Publication No. 4-263199 "Semiconductor-Integrated Memory", and the like.

FIG. 26 is a block diagram showing an example of a structure of a portion for referring to the associative memory 505 shown in FIG. 25. In the structure of FIG. 26, the address bits of a cell to be replaced are stored in memory cells A0 (600), A1 (601), . . . , A29 (629) of an associative memory (corresponding to the address portion of FIG. 24). Coincidence of the content of the associative memory with the address bits A0_ext, A1_ext, . . . , A17_ext inputted from the outside is judged in a plurality of EOR gates (exclusive OR gates) 520, 520, . . . . Further, coincidence or noncoincidence of all the bits is judged by receiving the outputs of those gates with a NOR gate 521, and a coincidence detection signal (word line) is outputted. If both coincide, memory cells A18 (618), . . . , A29 (629), memory cell data 630 corresponding to the data portion of FIG. 19, and a memory cell flag 631 for storing flag data showing a usage state (whether or not the relevant entry is valid) of the memory cell data 630 are selected and the data of each memory cell is outputted to a bit line. Thus, changeover by the selector is performed by referring to data of these word line and bit lines.

As described above, in a conventional semiconductor device, replacement of a bit defect has been performed by using an associative memory. However, since an associative memory is composed of a combination of a logic gate portion and a memory cell portion, the attempt to increase the number of replaceable bit cells tends to make the circuit more complicated in structure and larger in scale. Therefore, particularly when the capacity of a spare memory cell group is to be enlarged, there occurs a problem in a measure of using an associative memory.

On the other hand, generally, in addition to being judged to be defective due to defective operation of a memory cell as described above, a semiconductor memory device may be judged to be defective due to a fact that it cannot meet required specifications because of deterioration in operating characteristic although it is not defective in operation. For example, there is deterioration in data retention characteristic (characteristic with respect to the magnitude of a data retention current) in a DRAM and the like. Since deterioration in data retention characteristic is caused by generation of a cell having a large leak current in bits, it is possible to relieve a semiconductor memory device that is defective in specifications by replacing a bit cell which is defective in data retention characteristic with a spare memory cell. On the other hand, in the prior art, for example, in case a DRAM having a good data retention characteristic (finally a DRAM having a small data retention current) is to be obtained by replacing each of bit cells defective in data retention characteristic, in order to use spare memory cells without waste, there was only a method using an associative memory as shown in FIG. 24.

Since a conventional technique using an associative memory intended primarily to relieve a hardware error, it was enough to prepare an associative memory having small capacity. In order to improve the data retention (or data holding) characteristic, however, it is sometimes necessary to replace memory cells of about 0 to 1 percent of a basic memory with spare memory cells, and it was difficult to replace a great number of memory cells (about 0 to 1 percent) by using memory cells each having a large area like an associative memory for the purpose of improving the data retention characteristic.

As described above, in order to improve a data retention characteristic, it is necessary to relieve a large number of bit cells existing in a DRAM and the like. Up to now, however, with respect to the relief of a large number of bit cells, since there is a problem of the mounting area of an associative memory and in general there is a problem of quality in case a chip having a great number of defective bit cells is relieved, such a meaningless relief has not been performed. In other words, the reason is that it is conceivable that, since such a chip originally has poor quality, even if bit cells which are really defective due to defective operation are relieved, defects are liable to appear on portions other than relieved portions immediately after the chip is used in practice.

On the other hand, there is a demand for making longer a data retention time for use in a portable telephone and the like. In order to improve the data retention time, it is necessary to relieve a great number of bit cells. Also, since this relief is performed not to relieve a really defective bit cell but to relieve a bit cell having a short retention time (having a short data retention time), it is also meaningful to relieve a number of defective cells. That is to say, in order to relieve bit cells having short data retention time, it is also effective to replace a large number of bit cells.

SUMMARY OF THE INVENTION

Therefore, it is an object of the present invention, to obviate disadvantages of the conventional semiconductor memory device and a memory system using the same.

It is another object of the present invention to provide a semiconductor memory device and a memory system using the same in which a larger number of memory cells can be efficiently replaced with spare memory cells.

It is still another object of the present invention to provide a semiconductor memory device and a memory system using the same in which a larger number of memory cells can be efficiently replaced with spare memory cells without using a complex circuit structure.

It is still another object of the present invention to provide a semiconductor memory device and a memory system using the same in which a larger number of memory cells can be efficiently replaced with spare memory cells without using a circuit structure having large scale.

It is still another object of the present invention to provide a semiconductor memory device and a memory system using the same in which a data retention characteristic can be easily and efficiently improved.

According to an aspect of the present invention, there is provided a semiconductor memory device comprising: a memory cell array for relief which stores plural pieces of information for identifying bit cells to be replaced and provides memory cells for replacing in bits arbitrary memory cells existing in a basic memory according to these pieces of information; a decoder for allocating address signals be supplied to the basic memory to an index portion and a tag portion and for decoding an address allocated to the index portion; a comparator for comparing an address allocated to the tag portion with information specified by an output of the decoder out of information for identifying bit cells to be replaced, the information for identifying bit cells to be replaced being stored in the memory cell array for relief; and a selector for selecting and connecting either of memory cells in the basic memory and memory cells in the memory cell array for relief with the outside on the basis of an output of the comparator.

In this case, it is possible to dispose the basic memory on the same chip where the memory cell array for relief is disposed.

It is preferable that the information for identifying the bit cells to be replaced is written into the memory cell array for relief from a nonvolatile memory when turning on power of the semiconductor memory device.

It is also preferable that the basic memory and the nonvolatile memory are disposed on the same chip where the memory cell array for relief is disposed.

It is advantageous that the semiconductor memory device further comprises an address converter as a circuit means for allocating address signals to be supplied to the basic memory to the index portion and the tag portion, wherein the address converter performs an address conversion including rearrangement of address signals on the basis of the information stored in a nonvolatile memory, when allocating the address signals to be supplied to the basic memory to the index portion and the tag portion.

It is also advantageous that the information for rearrangement of address signals is the information stored in the nonvolatile memory on the basis of a result of an operation test of the basic memory.

It is further advantageous that the nonvolatile memory storing the information for rearrangement of address signals and a nonvolatile memory for storing information for identifying the bit cells to be replaced are disposed on the same chip.

It is preferable that the memory cell array for relief also stores flag information for indicating whether each of the plural pieces of information for identifying bit cells to be replaced is valid or not, in addition to storing the plural pieces of information for identifying bit cells to be replaced.

It is also preferable that the flag information is combined with the information for identifying bit cells to be replaced.

It is further preferable that the basic memory and the memory cell array for relief are formed out of memories requiring a refreshing operation for retaining memory, and a refreshing operation is performed more frequently for the memory cell array for relief than for the basic memory.

It is also preferable that the information for identifying the bit cells to be replaced which is stored in the nonvolatile memory are data corresponding to bit cells having poor data retention characteristic in the basic memory composed of a DRAM.

It is advantageous that at least one of the basic memory and the nonvolatile memory is disposed outside a chip of the semiconductor memory device.

It is also advantageous that the address conversion is performed so as to avoid using defective portions of the memory cell array for relief.

It is further advantageous that the memory cell array for relief comprises a memory cell array which includes memory cells each having a combination of a SRAM cell and ferroelectric capacitor elements.

According to another aspect of the present invention, there is provided a semiconductor memory system comprising: a basic memory portion; a memory cell array for relief which stores plural pieces of information for identifying bit cells to be replaced and provides memory cells for replacing in bits arbitrary memory cells existing in the basic memory portion according to these pieces of information; a nonvolatile memory for supplying the information for identifying bit cells to be replaced to the memory cell array for relief; a decoder for allocating address signals be supplied to the basic memory portion to an index portion and a tag portion and for decoding an address allocated to the index portion; a comparator for comparing an address allocated to the tag portion with information specified by an output of the decoder out of information for identifying bit cells to be replaced, the information for identifying bit cells to be replaced being stored in the memory cell array for relief; and a selector for selecting and connecting either of memory cells in the basic memory portion and memory cells in the memory cell array for relief with the outside on the basis of an output of the comparator.

In this case, it is preferable that at least one of the basic memory portion and the nonvolatile memory is disposed outside a chip of other portion of the semiconductor memory system.

It is also preferable that the basic memory portion comprises a plurality of memory chips.

It is further preferable that the semiconductor memory system further comprises, in place of the nonvolatile memory and the memory cell array for relief, a memory cell array which comprises memory cells each having a combination of a SRAM cell and ferroelectric capacitor elements.

According to still another aspect of the present invention, there is provided a method of selling a semiconductor memory device comprising: accompanying the semiconductor memory device with serial number information; selling the semiconductor memory device accompanied with the serial number information; and providing property information of the memory device in relation to the serial number information.

In this case, it is preferable that the property information of the memory device is provided over the Internet in relation to the serial number information.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIG. 2 is a block diagram showing a circuit structure used for realizing a set-associative method in the semiconductor memory device system according to the present invention;

FIG. 4 is a diagram for explaining the basic principle of an address conversion method according to the present invention;

FIG. 5 is a diagram for explaining the basic principle of an address conversion method according to the present invention;

FIG. 15 is a diagram for explaining the basic principle of an address conversion method when a defective cell is included in a memory cell array for relief according to the present invention;

FIG. 16 is a diagram for explaining the basic principle of an address conversion method when a defective cell is included in a memory cell array for relief according to the present invention;

DESCRIPTION OF A PREFERRED EMBODIMENT

Figure 1:
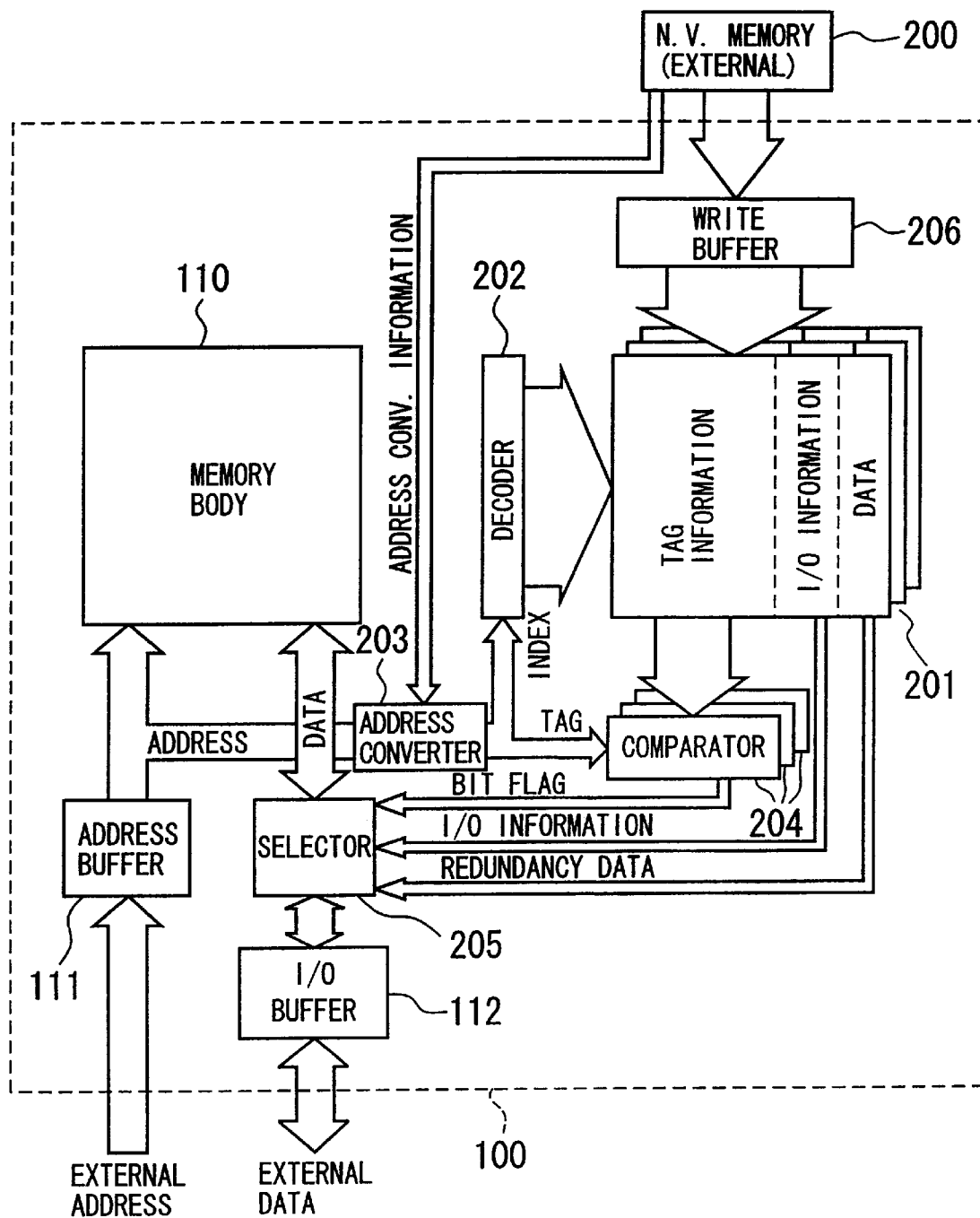
FIG. 1 is a block diagram showing an embodiment of a semiconductor memory device system according to the present invention.

Embodiments of the present invention are described with reference to the drawings in the following. FIG. 1 is a block diagram showing an example of a structure of a semiconductor memory device system using a semiconductor memory device according to the present invention. A system of FIG. 1 is composed of a semiconductor memory device 100 composed of one chip and a nonvolatile memory 200 which is provided outside the semiconductor memory device 100 and which is connected to the semiconductor memory device 100 through a plurality of signal lines. The semiconductor memory device 100 is composed of a basic constituent part of the memory device, said basic constituent part being composed of a memory body or a basic memory 110 formed out of a DRAM, an address buffer 111 provided between an external address bus and the basic memory 110, and an I/O buffer 112 provided between an external data bus and the basic memory 110, and a redundant constituent part for providing spare memory cells to the basic memory 110.

The redundant constituent part is composed of: a memory cell array 201 for relief which is composed of the same DRAM as the basic memory 110 and is provided with plural sets of spare memory cell arrays (hereinafter, plural sets are described as n ways (n is a natural number); a decoder 202 which takes an index address outputted from an address converter 203 as input and outputs a word line signal to the memory cell array 201; an address converter 203 which allocates and converts address data supplied from the address buffer 111 to an index address and a tag address on the basis of address conversion information supplied from the nonvolatile memory 200; a plurality of comparators 204 for comparing with each other the TAG information inside the memory cell array 201 and tag addresses outputted from the address converter 203; a selector 205 which is provided between a data bus of the basic memory 110 and an input/output bus at the inner side of the I/O buffer 112 and takes as input a hit flag outputted from the comparator 204, I/O information in the memory cell array 201 and redundancy data in the data portion of the memory cell array 201, and connects selectively either of data in the basic memory 110 and redundancy data of the memory cell array 201 to the respective bit lines of the input/output bus at the inner side of the I/O buffer 112; and a write buffer 206 which is a buffer for data to be written from the nonvolatile memory into the memory cell array 201.

In the above-mentioned structure, at the time of turning power on, the address information of bit cells having poor data retention characteristic is written into the memory cell array 201 from the external nonvolatile memory 200 through the write buffer 206. When the basic memory 110 is accessed from the outside, data inside the memory cell array 201 and an input address inputted from the external address bus through the address buffer 111 are compared with each other by a set-associative method, and in case that they hit each other, a hit flag from the comparator 203 is set and a bit replacement using the corresponding redundancy data inside the memory cell array 201 is performed by the selector 205. At this time, the address converter 203 allocates the input address to the index side or the TAG side on the basis of the address conversion information.

When viewed from the outside, in case the semiconductor memory device 100 is used, an address is inputted to the basic memory 110 from the outside. An external address is outputted to the basic memory side and the memory cell array side, and data outputted from the basic memory 110 or data for relief outputted from the memory cell array 201 is selected and outputted by the selector 205, but an access to the semiconductor memory device 100 is not changed by the existence of the redundant constituent part.

A conversion method using the address converter 203 can be set by address conversion information inside the nonvolatile memory 200 and can be changed for each device. Also, it is preferable that the data retention time of the memory cell array 201 can be secured so as not to be shorter than a specified value, by refreshing the memory cell array 201 more frequently than the basic memory 110. Further, in the above-mentioned structure, the memory cell array 201 is provided with input/output buses independently of the basic memory 110 and provides bit cell relieving data. Such memory cell array 201 can be provided on the same chip where the basic memory 110 is disposed as shown in FIG. 1, namely, can be provided on-chip, but it can also be provided off-chip outside the semiconductor memory device 100.

Figure 21:
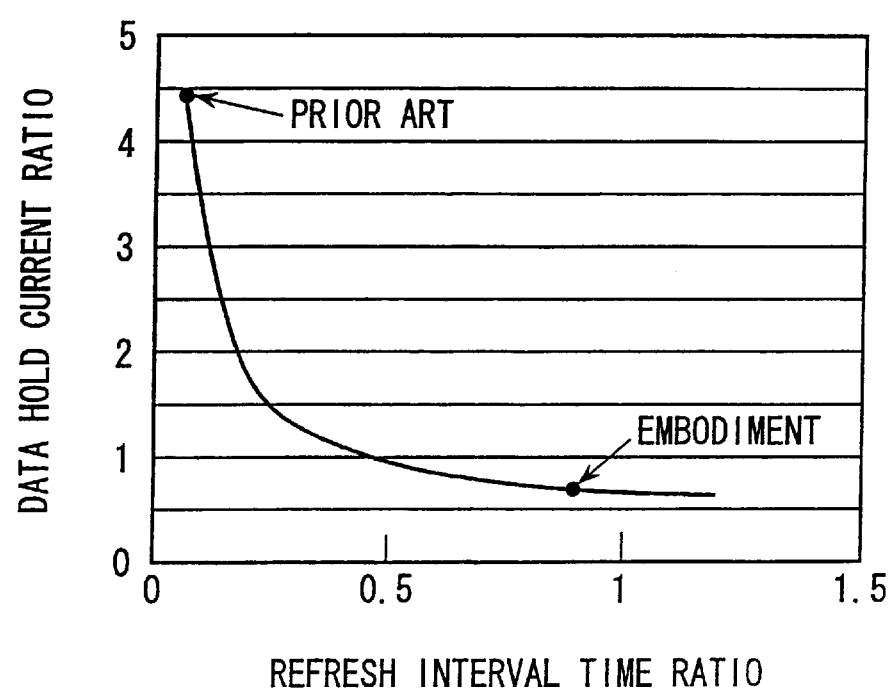
FIG. 21 is a view illustrating a result of simulation showing an effect of reducing a data retention current according to the present invention.

Here, the above-mentioned address comparison of a set-associative method according to the present invention is described in more detail. While the conventional example shown in FIG. 21 provides a replacing means using an associative memory in order to relieve defective bit cells bit by bit, the present invention provides a relieving memory and an address comparison means by means of a set-associative method. A conceptual diagram of it is FIG. 2. FIG. 2 shows a circuit of one way portion and one index portion of the memory cell array 201. In the circuit of FIG. 2, addresses are divided into the index side (A0_ext, A1_ext, ..., A12_ext and A13_ext) and the tag side (A14_ext, ..., A17_ext), and the index side address of an external address is inputted into an simple decoder (AND gate) 301 existing inside the decoder 202. Hereupon, signals A0_ext, A1_ext, ..., A17_ext correspond respectively to the highest bit, the second highest bit, ..., the 16th highest bit. Also, in this example, as a whole in the decoder 201, there are $2^{14}$ decoders combined with a plurality of inverters for selecting index addresses different from that of an AND gate similar to the decoder 301.

When a word line signal is outputted from the decoder 301, an address at the tag side stored in memory cells 314 to 317 selected by that output is read out, and it is judged by four EOR gates 302, 302, ... and a NOR gate 303 whether or not the address coincides in bits with the tag portion of an external address. If a coincidence detection signal is outputted from the NOR gate 303, a bit replacement by the corresponding memory cell (memory cell data) is performed according to data stored in memory cells 318 (memory cell A18), ..., 329 (memory cell A29), 330 (memory cell data), and 331 (memory cell flag) in the same way as the case in which an associative memory is used as shown in FIG. 21.

In this way, according to the structure using a set-associative method of the present invention, it is possible to obtain such advantages as that the cell array of a relief memory (memory cell array 201) can be very simple in structure, the decoder can also be made very simple in structure, the number of EOR gates for detection of coincidence can be made much smaller than that of the prior art, and the like. Therefore, only a very small area is needed for performing the same function as an associative memory as shown in FIG. 21. However, although the speed of data replacement is made somewhat slower when compared with a method of using an associative memory as shown in FIG. 21, since a large capacity of spare memory can be easily obtained, the method of the present invention is preferably used for performing a large amount of bit replacement in a semiconductor memory device such as a DRAM and the like which is not required to be so fast as an SRAM and the like.

Figure 3A:
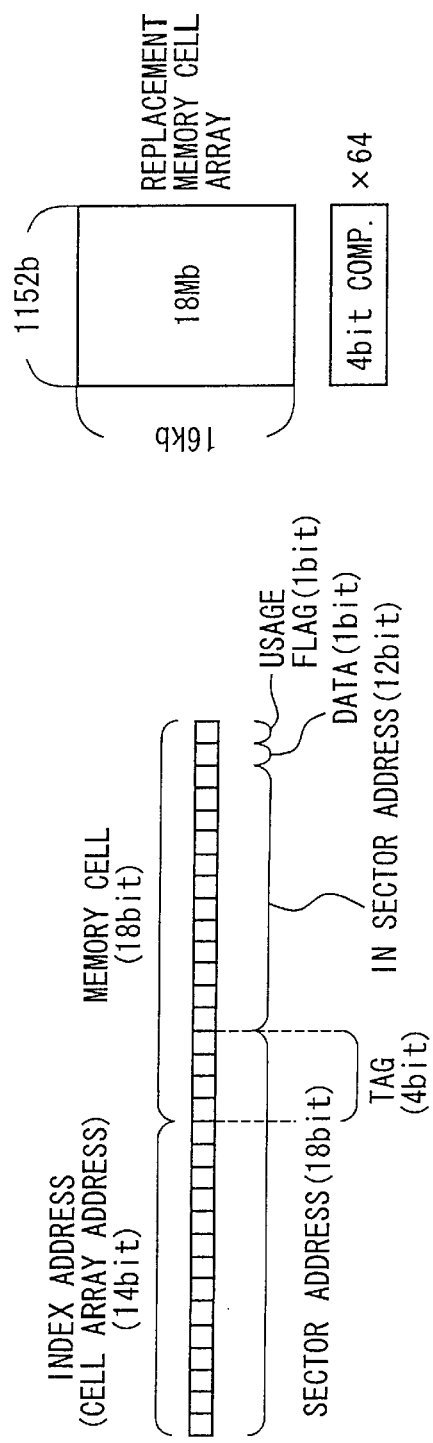
FIG. 3A is an explanatory diagram showing data allocation of memory cells and composition examples of memory cell arrays for replacement according to the present invention.
Figure 3B:
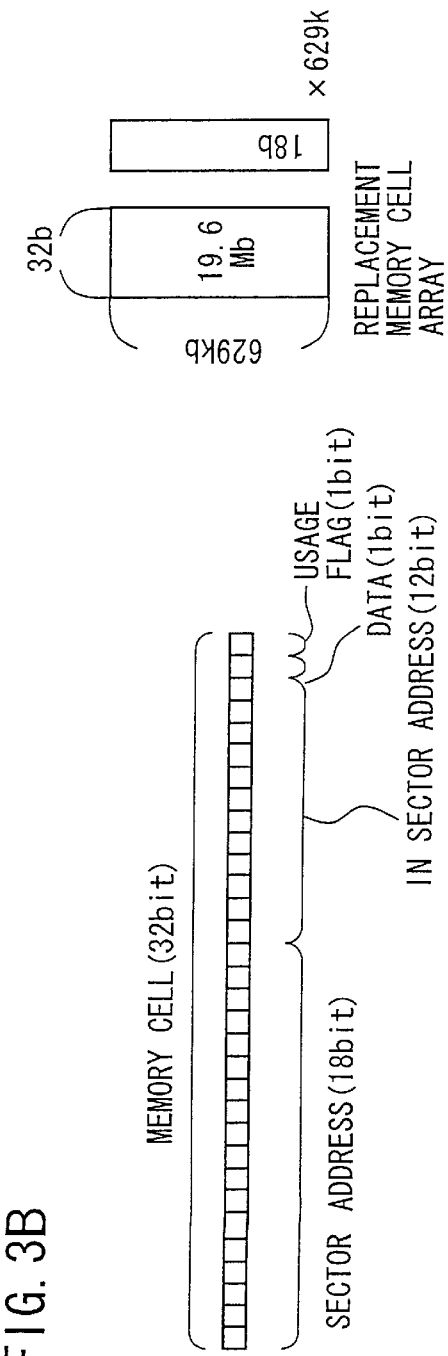
FIG. 3B is an explanatory diagram showing data allocation of memory cells and composition examples of memory cell arrays for replacement according to a conventional example.
Figure 26:
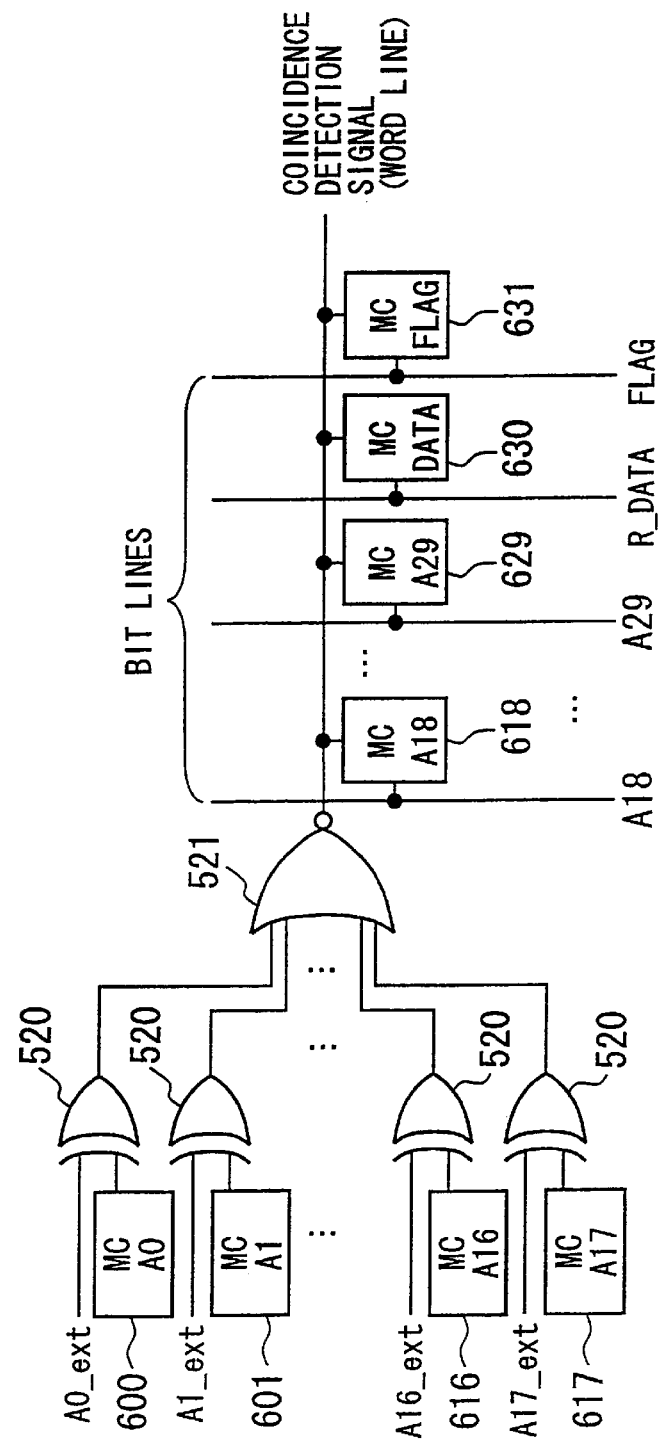
FIG. 26 is a block diagram showing the circuit structure of a cell array for replacement in case an associative memory is used according to the prior art.

FIGS. 3A and 3B are explanatory diagrams for comparing with each other the set-associative method (FIG. 3A) according to the present invention shown in FIG. 2 and the conventional method (FIG. 3B) using an associative memory shown in FIG. 26. FIGS. 3A and 3B show examples of the address allocation in an address conversion, the constitution of a memory cell array for replacement and the constitution of comparators, in the following condition. That is, the capacity of the basic memory 110 is 1 Gbit (an external address has 30 bits and one sector has 512 bytes (where a sector address has 18 bits and an in-sector address has 12 bits)), and a memory cell array for replacement having the capacity of data for replacement corresponding to about 0.06 percent (=about 600 kilobits) of the memory of 1 gigabit is prepared.

FIG. 3A shows the case in which 14 bits are taken as an index address (a cell array address), 4 bits are taken as a tag address out of a sector address of 18 bits for the basic memory of 1 Gbit and in which the memory cell array 201 is constituted as a 64-way structure. In this case, the capacity of a memory cell array for replacement (corresponding to the memory cell array 201 of FIG. 1) becomes 18 Mbits in which the number of bits in the direction of rows is 16 kbits (=$2^{14}$ bits (corresponding to an index address (14 bits))) and the number of bits in the direction of columns is 1,152 bits (18 bits (memory cell)×64 ways). Also, a comparing means for selecting an arbitrary one sector address from sector addresses of 18 bits is composed of a combination of 16 k decoding circuits (corresponding to the decoder 202 of FIG. 1) for decoding index addresses of 14 bits and 64 (corresponding to 64 ways) comparators (corresponding to comparators 204 of FIG. 1) of 4 bits (corresponding to a tag address).

As described above, in case 14 bits are taken as an index address, memory cells capable of being read and written in the memory cell array for replacement become 18 bits for one bit data (redundancy data) for replacement. In this case, memory cells of 18 bits contain tag information of 4 bits, sector address information of 12 bits, data of 1 bit and a usage flag of 1 bit. Here, the tag information of 4 bits corresponds to tag (TAG) information inside the memory cell array 201 of FIG. 1, the usage flag of 1 bit corresponds to I/O information, and the data of 1 bit corresponds to the data (redundancy data). Also, tag information of 4 bits, in-sector address information of 12 bits and I/O information of 1 bit out of memory cells of 18 bits are stored in the nonvolatile memory 200 of FIG. 1, for each one data bit.

By the way, as shown in FIG. 3A, in case of a set-associative method of 64 ways, a 14-bit index address and a 4-bit tag address, in order to relieve about 0.06 percent of a memory of 1 Gbit, it can be said that it is enough to prepare a replacement memory array having a capacity of 18 Mbits, but there is a great difference in difficulty between manufacturing a non-defective memory device of 1 Gbit and manufacturing a non-defective memory device of 18 Mbits. However, since it is necessary to prepare bit cells each having a long data retention time for 18 Mbits for replacement, it is possible, for example, to refresh only these bit cells frequently as described above, or to constitute these bit cells redundantly. For example, in case refreshing operation is performed frequently, since a small area of 18 Mbits does not consume electric current so much for refreshing, the characteristic of current consumption is not greatly deteriorated as a whole.

On the other hand, the prior art shown in FIG. 3B needs about 620,000 comparators of 18 bits and a memory of 19.6 Mbits (memory cells of 32 bits). The structure of the present invention and that of the prior art are apparently different from each other in the number of comparators. In case of a memory device having large capacity, a set-associative method like the present invention is overwhelmingly more advantageous. A memory referring method using an associative memory according to the prior art shown in FIG. 3B is a technique called a full-associative method, in contrast with a set-associative method of the present invention.

Next, operation of the address converter 203 shown in FIG. 1 is described together with an explanation of the basic concept of address conversion in a set-associative method according to the present invention. Since the set-associative method according to the present invention identifies correspondence of the index address portion and a word line of the memory cell array 201 only by means of decoding by the decoder 202, it is a required precondition that the addresses of defective bit cells stored (hereinafter, a bit cell having a short data retention time is also called a defective bit cell) are evenly distributed. For example, while in a method using an associative memory as shown in FIG. 3(B) the number of replaceable bit cells is limited only by the capacity of a memory cell array for replacement, in the structure of FIG. 3(A) there is a limit that only one defective bit cell per way can be replaced in the same sector. Therefore, when bit cells to be replaced are partially distributed, the efficiency of replacement is degraded. Accordingly, the present invention makes the memory cell array 201 have a plurality of ways and attempts to obtain the combination of addresses (address conversion method) in which defective bit cells are distributed as evenly as possible by providing the address converter 203 for applying an address conversion to an external address.

The basic concept of an address conversion method of the present invention is described with reference to FIGS. 4 and 5. Here, a case of replacing addresses of the index side and the tag side with each other is described as an example of an address conversion method of the present invention. A case of 1 way (what is called a direct mapping method) is described in the following. A set-associative method requires as a precondition the fact that defective bit cells exist one by one separately in the respective sections when an array is divided as shown in FIG. 5. The set-associative method shown here uses an address given to each section as an index and an address inside each section as a tag when storing an address of "x" (defective bit cell, namely, a memory cell having a short data retention time) in FIG. 5.

For example, the value of an address of "0033" indicates that "33" (tag) exists as data in an address of "00" (index) inside the memory cell array (see FIG. 1). Therefore, when "0033" is inputted as an external address, "00" is extracted as an index and the tag portion of the external address and a tag outputted from a relief cell array are compared with "33" and if they coincide, data stored in a "data" memory cell of the memory cell array for relief is used as redundancy data. On the other hand, if tag information read out from the relief cell array is "22" for example, since both of them do not coincide, "data" at the relief cell array side is not used.

In the structure described above, in case of 1 way, if there are two or more defective bit cells in one section, the defective bit cells cannot be relieved. On the contrary, this embodiment improves the possibility of relieving defectives by changing addresses by means of the address converter 203 in order that "x"s are placed one by one in the respective sections as evenly as possible.

For example, when there are 4 defective bit cells as a whole, since there are two defective cells in a section of index "00" in FIG. 4, the set-associative method has failed. At this time, it is assumed that the addresses of the two defective cells are respectively "0010" and "0011", for example. In this case, if the addresses of the index side and the tag side are replaced with each other, the respective addresses become "1000" and "1100", and defective cells in this case come to be dispersed, for example, as shown in FIG. 5, so that the memory cells can be relieved. In this way, this embodiment attempts to find such an address conversion method (rule) that performs an address conversion from FIG. 4 to FIG. 5 for each chip according to a result of detection of defects performed for each chip and to write a found conversion method as address conversion information into the nonvolatile memory 203. Thereby, in this embodiment, a conversion specified by the address conversion information is performed by means of the address converter 203.

As an address conversion method, it is only enough if it can evenly distribute defectives, and it is not necessary to take the trouble to perform an address conversion (the address converter 203 itself may be omitted) if defectives are already distributed evenly. It is important in itself to rearrange addresses, and replacing the index and tag portions with each other is only a concrete example.

By adopting a set-associative method of 64 ways, a maximum of 64 defective cells in one section can be accepted. That is to say, in case of adopting a set-associative method of n ways, a maximum of n defective bit cells in one section (for example, 512 bytes) can be relieved. Also, in order to relieve defective cells of, for example, 0.06 percent as a target, it is desirable to prepare a relief cell array which is not 0.06 percent of a basic memory but which is more than 0.06 percent, for example, about 1 percent (about double) of the basic memory. Even if such a structure is used, since the number of decoders is smaller, the present invention is more advantageous than the prior art. This is because, an associative memory can be entirely used up but in the set-associative method a relief cell array cannot be entirely used up.

Figure 6:
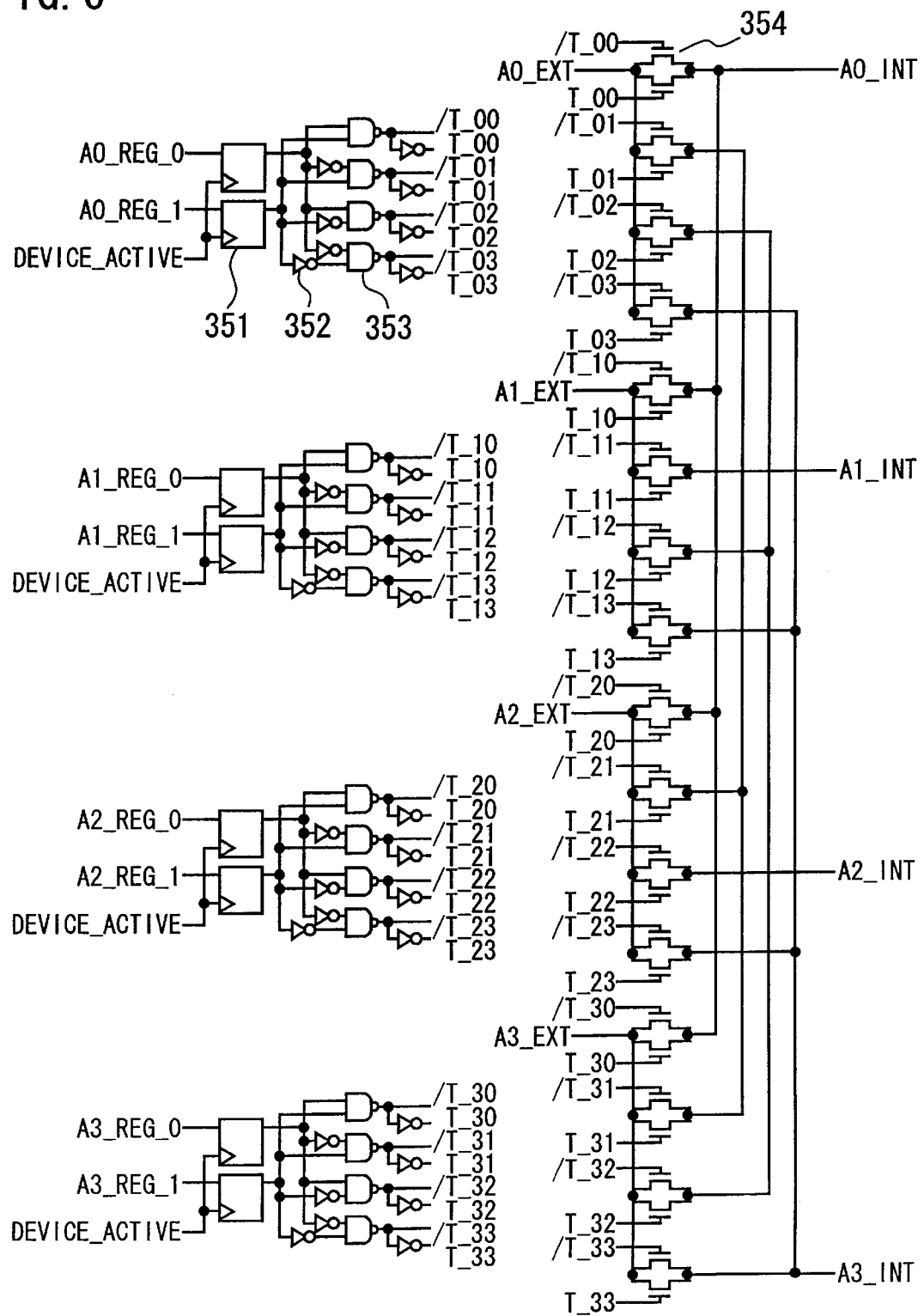
FIG. 6 is a circuit diagram showing an example of a concrete circuit structure of an address converter 203 shown in FIG. 1.

FIG. 6 shows an example of a concrete circuit structure of the address converter 203. In FIG. 6, signal A0_EXT, signal A1_EXT, signal A2_EXT and signal A3_EXT are input signals to the address converter 203 of FIG. 1, and correspond to the upper 4 bits of an external address. Also, signal A0_INT, signal A1_INT, signal A2_INT and signal A3_INT are output signals of the address converter 203 of FIG. 1, and correspond to the upper 4 bits of an index address. Further, signal A0_REG_0, signal A0_REG_1, signal A1_REG_0, signal A1_REG_1, signal A2_REG_0, signal A2_REG_1, signal A3_REG_0 and signal A3_REG_1 are signals corresponding to address conversion information outputted from the nonvolatile memory 200 of FIG. 1. Also, reference symbol 351 represents a register for latching input data by signal DEVICE_ACTIVE, reference symbol 352 represents an inverter gate, reference symbol 353 represents a NAND gate, and reference symbol 354 represents a transmission gate or a transfer gate (ON/OFF switch).

The address converter shown in FIG. 6 changes connections between input lines for respective bits of an inputted address and output lines of the address converter by an arbitrary connection method on the basis of signals A0_REG_0, . . . , A3_REG_1. A plurality of registers 351 are prepared in order to specify how each switch 354 is to be switched, and when power is turned on, from the nonvolatile memory 200 into which data of a conversion method have been written in advance, addresses after conversion are loaded to the memory cell array 201 and information of the address conversion method is loaded into the address converter 203, and the addresses of bit cells to be replaced and the conversion method are determined. Thus, the system comes into a state in which defective cells can be relieved.

Setting of the address converter 203 is changed depending upon a chip. This is because, address conversion needs to be performed depending on the locations where defective cells appear. Also, conversion of addresses is performed when the basic memory 110 is used from the outside. Although an address conversion method is determined-according to a result of a defective bit cell detection test of the basic memory 110, it is necessary to check in advance that a defective cell relieving memory itself is non-defective (it has a satisfactory data data retention time).

In the above description, it has been described that it is preferable to refresh the memory cell array for replacement more frequently than the basic memory. This is because, this embodiment aims at relieving bit cells having poor data retention characteristic, and this is one of features of the present invention. Also, particularly in case the invention is applied to a DRAM device, it is necessary to relieve a large capacity of defective bit cells in order to relieve bit cells having poor data retention characteristic. The prior art method has a problem of increase in a chip area and the like and was difficult to adopt, but the present invention can be easily applied to a DRAM device, because, in the present invention, a memory replacement for defective bit cells is performed by adopting a set-associative method.

As described above, according to a semiconductor memory device and a system using the same of the present invention, even when, for example, aiming at improvement of the data retention characteristic in a DRAM device, since replacement data can be held in the DRAM cells, memory cells for replacement data can be easily made on-chip. Also, it is possible to reduce a chip area necessary for replacement by adopting a set-associative method. Further, it is possible to improve the efficiency of replacement by an address conversion. Because of these features, the number of refreshing operations per unit time can be reduced by finally replacing a number of cells having poor data retention characteristic, and it is possible to reduce the data retention current.

Figure 7:
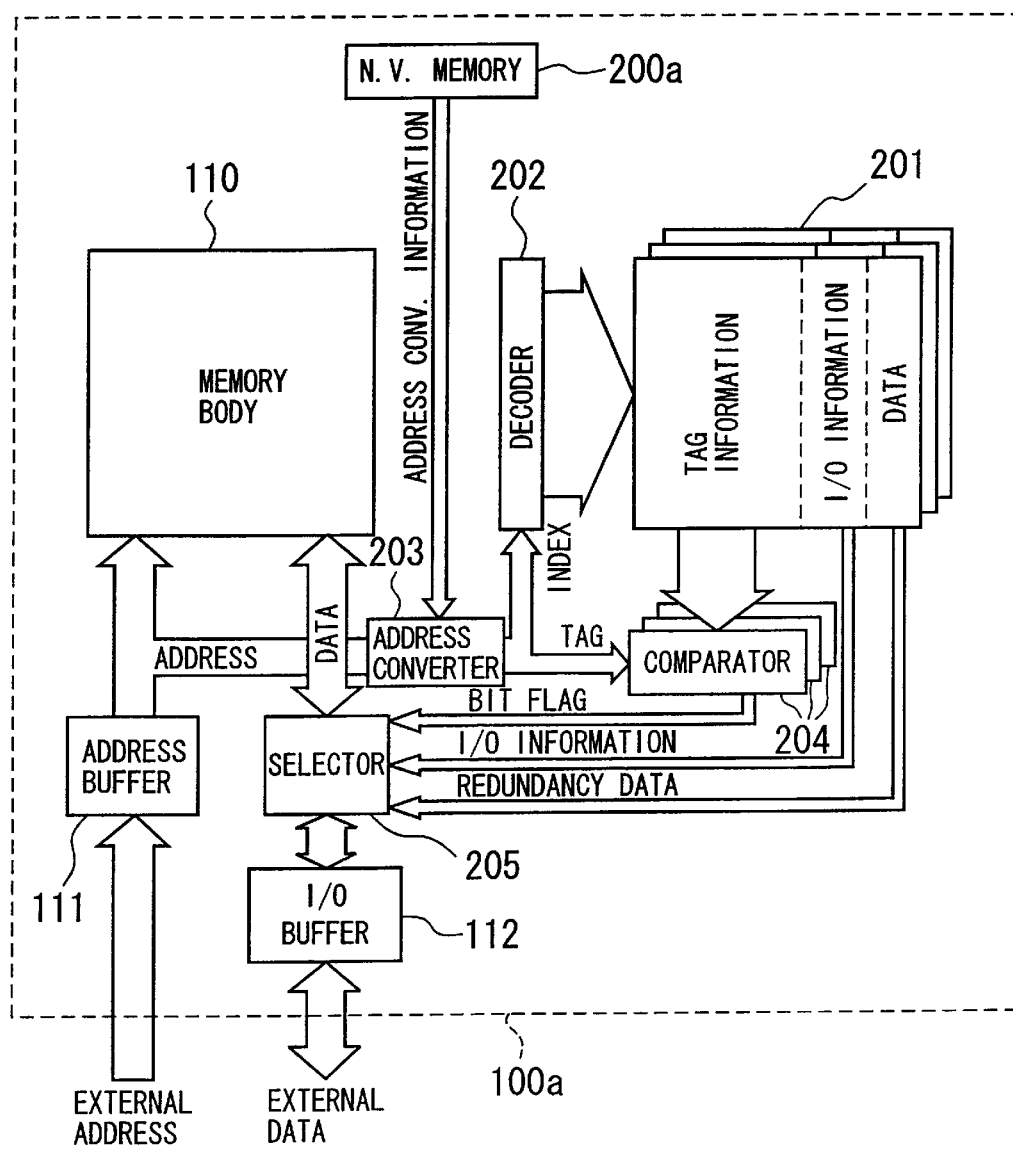
FIG. 7 is a block diagram showing another embodiment of a semiconductor memory device according to the present invention.

Next, another embodiment of the present invention is described. An embodiment shown in FIG. 7 has a constitution in which a nonvolatile memory 200a is disposed together in a semiconductor memory device 100a, namely, in the same chip, and the write buffer 206 shown in FIG. 1 is omitted. Function of each component is the same as that of the embodiment shown in FIG. 1. A case in which the nonvolatile memory 200a can be disposed together with the basic memory 110 as shown in FIG. 7 includes a case in which a process of fabricating together a DRAM constituting the basic memory 110 and a flash memory is used, a case where a semiconductor memory device is as a whole formed out of flash memories themselves including the basic memory 110, a case in which the nonvolatile memory 200a is formed out of the same memory as the basic memory (DRAM or the like) by using an anti-fuse system, or the like.

Figure 8:
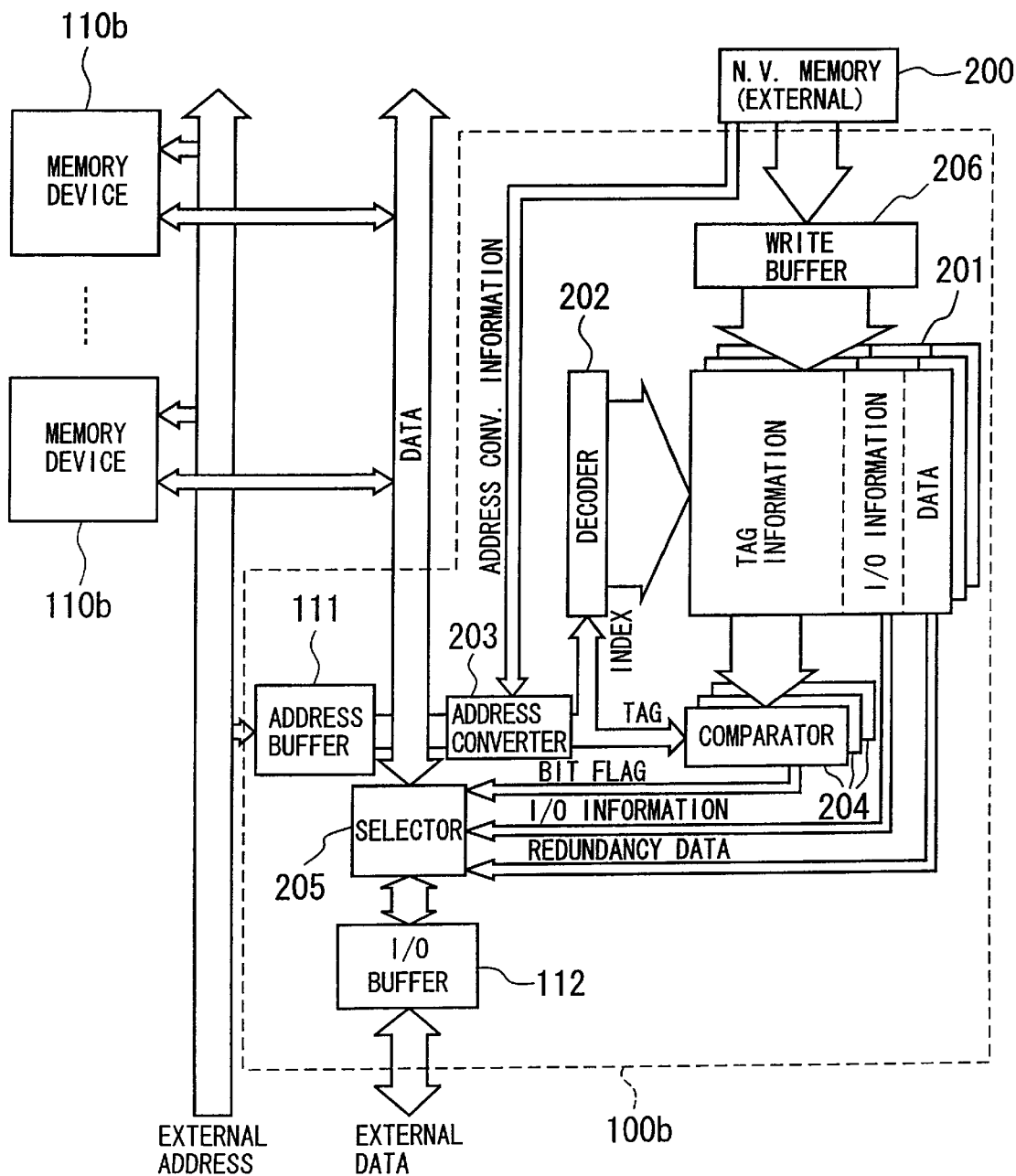
FIG. 8 is a block diagram showing still another embodiment of a semiconductor memory device system according to the present invention.

FIG. 8 is a diagram showing a still another embodiment of the present invention. A semiconductor memory device system shown in this drawing is composed of a semiconductor memory device 100b in which the basic memory 110 is omitted from the structure of FIG. 1 and a plurality of memory devices 110b each being provided as a separate body from the semiconductor memory device 100b. The memory devices 110b, . . . have the same structure as that of the basic memory 110 of FIG. 1 except that each of them is provided as a separate body from the semiconductor memory device 100b forming a portion for replacing the memory.

Figure 9:
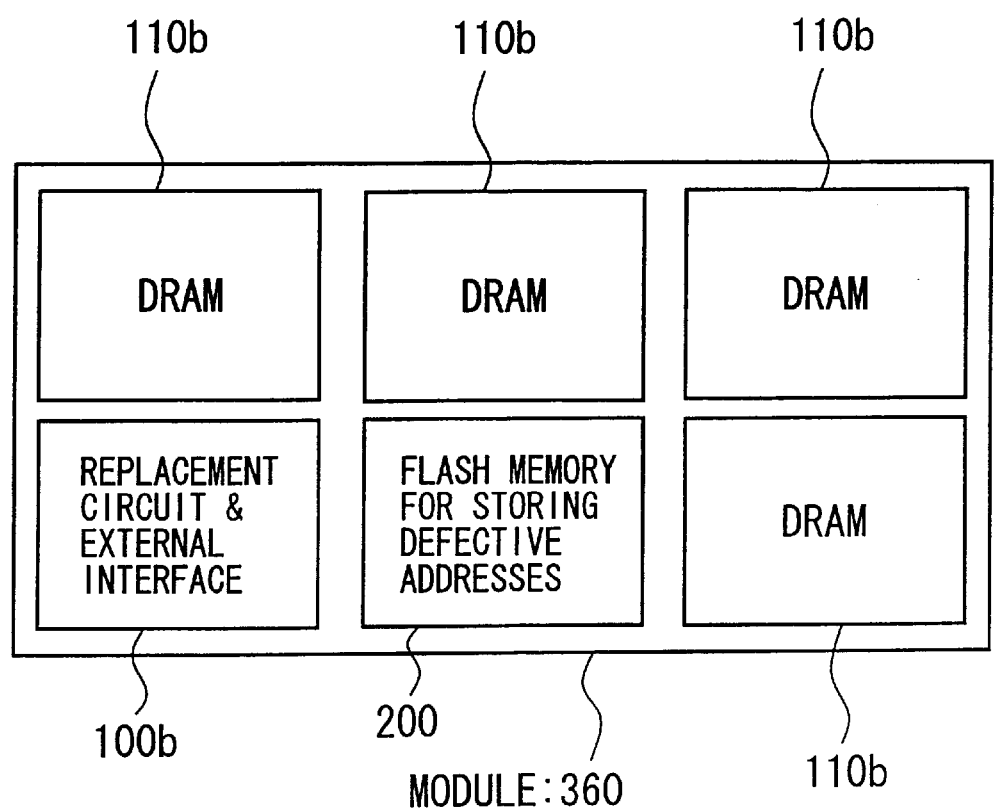
FIG. 9 is a plan view showing an example of a structure when a semiconductor memory device system according to the present invention is constituted as a module.

FIG. 9 is a plan view showing an example of a structure forming a system shown in FIG. 8 as a module (memory module 360). The structure of FIG. 8 has a semiconductor memory device 100b, a nonvolatile memory 200, and a plurality of memory devices 110b mounted on the same substrate. A plurality of memory devices 110b can be composed, for example, of DRAMs, and a nonvolatile memory 200 for storing addresses of defective cells can be composed of a flash memory. However, the nonvolatile memory 200 is not limited to a flash memory but may be any memory only if it is a nonvolatile memory. Also, instead of using a memory cell array 201 inside the semiconductor memory device 100b, a method is also conceivable in which an address of replacement is directly read out from a flash memory. In this case, the area of the semiconductor memory device 100b can be made small. However, since the operating speed of a flash memory is generally slow, it is preferable from a viewpoint of the operating speed to form the memory cell array 201 out of an SRAM and the like and to load the address of replacement into such memory cell array 201.

Figure 10:
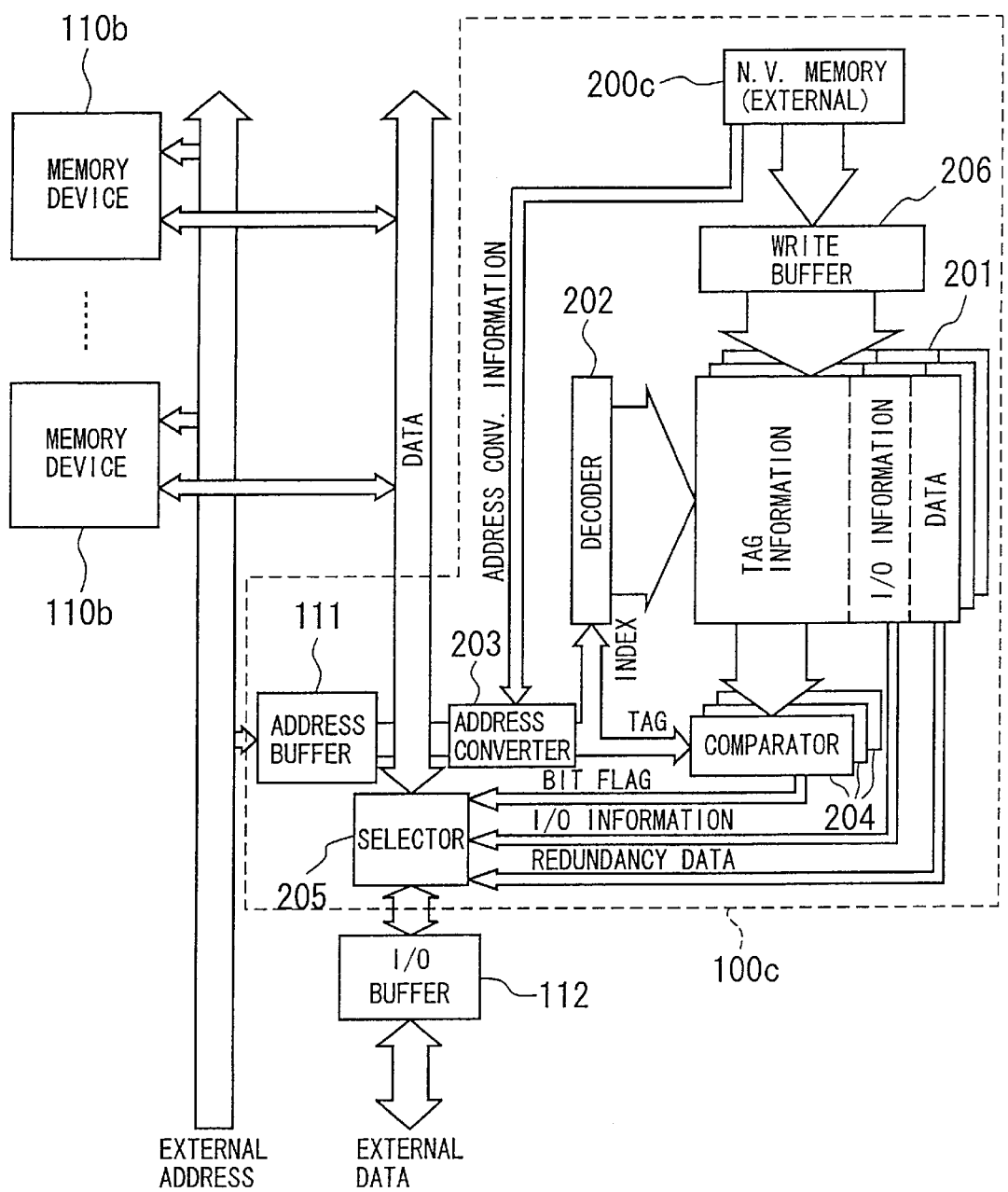
FIG. 10 is a block diagram showing still another embodiment of a semiconductor memory device system according to the present invention.

FIG. 10 is a diagram showing a still another embodiment of the present invention. A semiconductor memory device system shown in this drawing has a structure which is the same as that of FIG. 8, except that a nonvolatile memory 200c is disposed together in a semiconductor memory device 100c.

Figure 11:
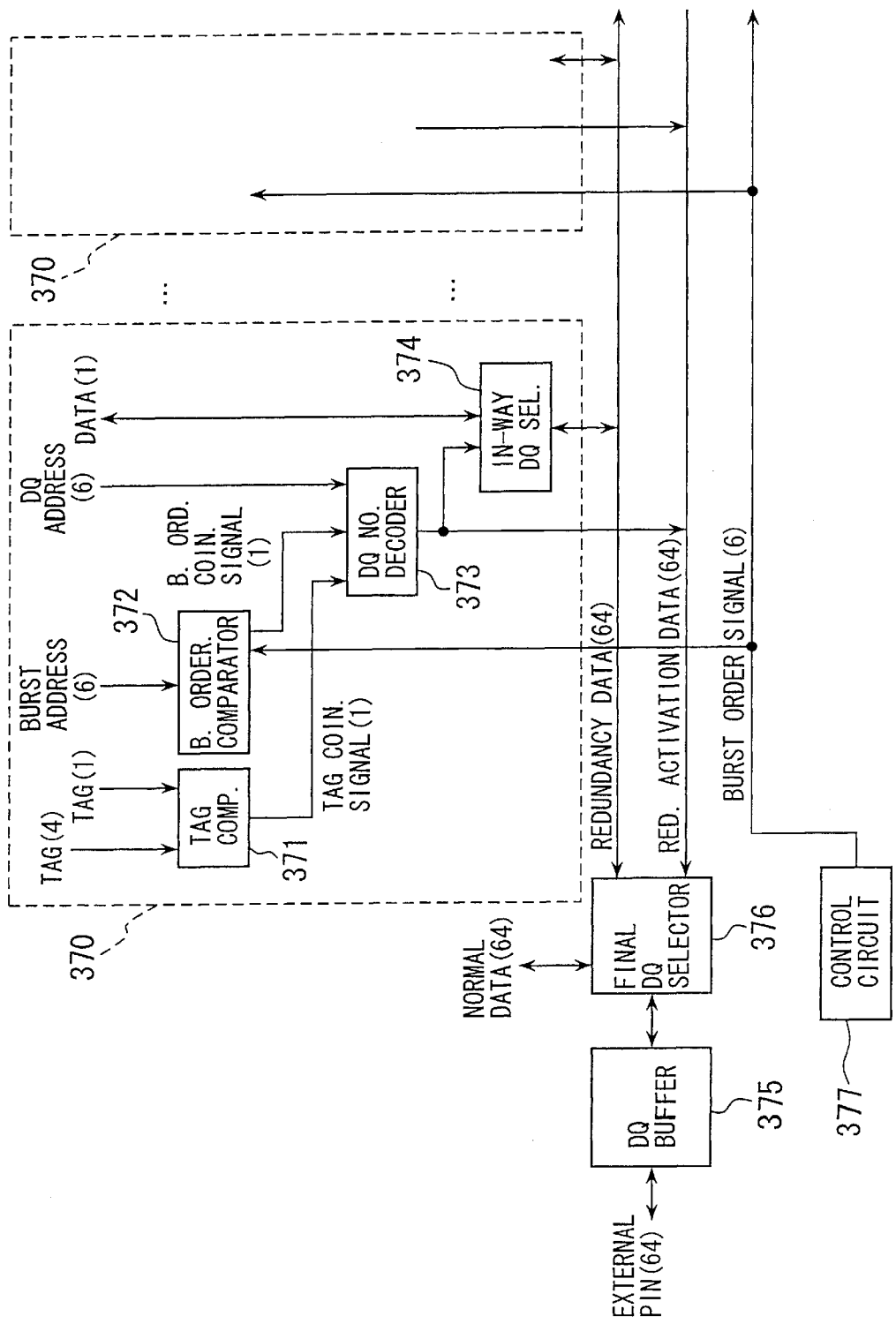
FIG. 11 is a block diagram showing an example of a circuit structure for realizing multi-way memory cell arrays for replacement in a semiconductor memory device according to the present invention.

Next, with reference to FIG. 11, an explanation will be made on an example of a structure within the comparator 204 and the selector 205 of FIG. 1. For example, in case a memory cell array 201 is formed so as to have a plurality of ways like the embodiment shown in FIG. 1, since the number of data lines becomes large when all the I/O information and the redundancy data are connected to the selector 205, it is thought that the wiring inside a chip becomes complicated. As a measure to avoid such disadvantage, for example, a constitution is conceivable in which I/O information and redundancy data are selected in advance for each way and they are wired-ORed for every way to be connected to the selector 205. FIG. 11 shows an example of the internal structure of the comparator 204 and the selector 205 when such structure is used.

A DQ buffer 375 is a component corresponding to the I/O buffer 112 of FIG. 1, and is connected to 64 external pins which are to be connected to an external data bus. A final DQ selector 376 forms a component corresponding to the selector 205 of FIG. 1 in conjunction with a plurality of in-way DQ selectors 374 each of which is provided for each way, and functions so as to selectively connect 64 data lines supplied from the DQ buffer 375 to either of ordinary data lines (64 lines) connected to the basic memory 110 and redundancy data lines (64 lines) connected through in-way DQ selectors 374 to the memory cell array 201. Redundancy activation flag lines (64 lines) connected to the final DQ selector 376 contain both of hit flag information and I/O information of FIG. 1, and the final DQ selector 376 selects data lines on the basis of data supplied from these 64 redundancy activation flag lines.

Figure 12:
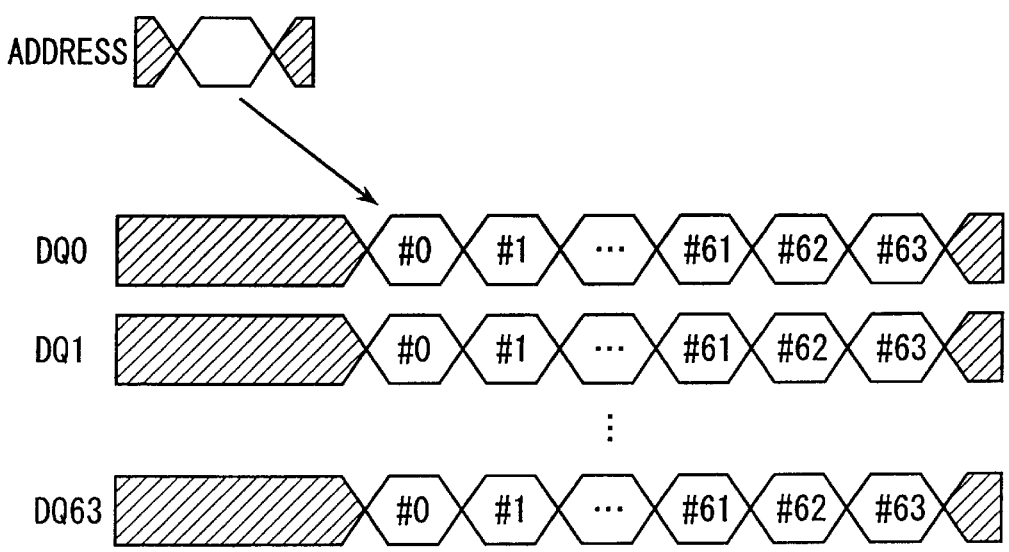
FIG. 12 is a timing chart showing transmission timing of data in the circuit structure of FIG. 11.

The number of external pins are 64, and assuming that data inputted and outputted through these pins are DQ0 to DQ63, the respective data are inputted and outputted serially in a burst mode, as shown in FIG. 12. Also, in FIG. 11, the redundancy data lines (64 lines) are connected to the in-way DQ selectors 374 in a wired-OR manner among the respective ways. A control circuit 377 of FIG. 11 repeatedly outputs a burst order signal of 6 bits for determining the order of transmission of burst signals. In each of controllers 370, 370, . . . which are provided for respective ways, there are provided a TAG comparator 371 and a burst order comparator 372. The TAG comparator 371 receives TAG information (4 bits) and a usage flag (1 bit) in the memory cell array 201 (see FIG. 3A) as inputs thereto and compares the TAG information with the tag portion in address data outputted from the address converter 203 and, if they coincide with each other, outputs a TAG coincidence signal. The burst order comparator 372 compares with each other a burst order signal and a burst address (6 bits) for specifying in what order in a burst the respective signals are to be transmitted, and outputs a burst order coincidence signal in case they coincide with each other.

A DQ number decoder 373 receives as inputs a TAG coincidence signal and a burst order coincidence signal which are outputted from these comparators and a DQ address of 6 bits for specifying what pin out of the 64 external pins input/output data corresponds to, and outputs a redundancy activation flag of 1 bit to either one corresponding signal line of 64 redundancy activation flag lines at a corresponding burst timing. An in-way DQ selector 374 selects data bit within a way on the basis of the output of the DQ number decoder 373 and connects it to one corresponding data line of the 64 redundancy data lines at a corresponding burst timing.

Figure 13:
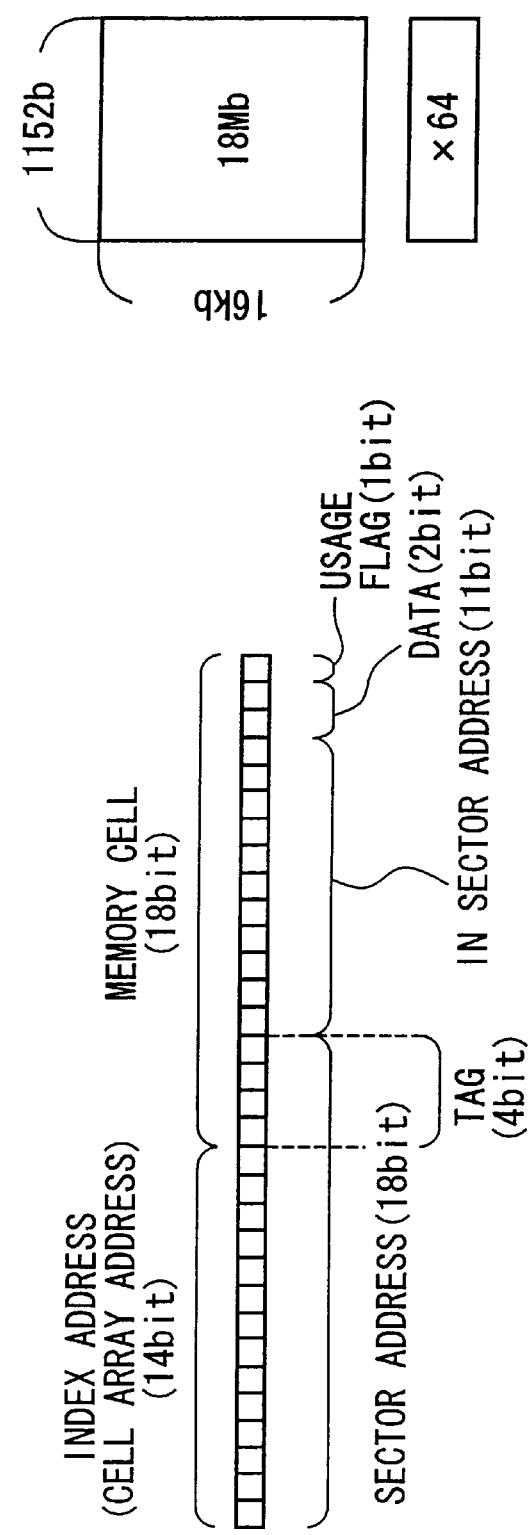
FIG. 13 is an explanatory diagram showing data allocation of memory cells and a composition example of a memory cell array for replacement in case the present invention is applied to a multi-valued memory.

FIG. 13 is a diagram showing an example of a constitution when the allocation of addresses and the constitution example of a memory cell array shown in FIG. 3A are applied to a multi-valued memory. In a multi-valued memory, when it is, for example, 4-valued memory, since information of 2 bits is included in one memory cell, its data is 2 bits and the number of bits of an in-sector address is reduced from 12 bits (in case of 2-valued memory) to 11 bits (in case of 4-valued memory). To increase data to 2 bits and reduce an address by 1 bit is equivalent in number of bits to the original state. This technique is often used in a general decoder and the like.

Figure 14:
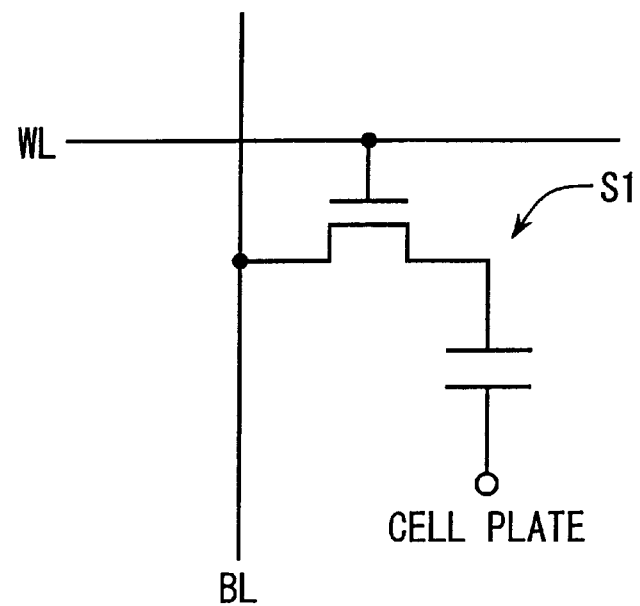
FIG. 14 is an explanatory circuit diagram for explaining a nonvolatile memory composed of a DRAM.

FIG. 14 shows an example of a structure of a memory cell in case a nonvolatile memory is integrated together in a DRAM device, and shows an example using an anti-fuse system. An anti-fuse is an element becoming a state opposite to that of a usual fuse, i.e., a short-circuited state. When writing data, voltages applied to a word line WL, a bit line BL and a cell plate are controlled such that a memory cell S1 of the DRAM device to be set at "LOW" is broken and an electric current is leaked intentionally, and thereby the value of the memory cell is set at "LOW". By doing so, the DRAM device can be used as a nonvolatile memory. Concretely, at the time of writing, the word line WL is set at 5 V and the cell plate is set at 10 V. Also, when "LOW" is to be written, the bit line BL is set at 0 V, and, when "HIGH" is to be set (non-writing), the bit line BL is set at 3.3 V. When data is to be read out, the corresponding cell is once written with 3.3 V each time. In a state where the cell plate is set at 0 V, a cell which is set at "LOW" is recognized as "LOW" since its voltage is made 0 V by a leak current, and on the other hand a cell which is set at "HIGH" is recognized as "HIGH" since it has a small leak current.

As described above, a semiconductor memory device and a system using the same according to the present invention are preferably used in case a basic memory is formed out of a device, for example, a DRAM, a flash memory or the like, which relatively provides a margin for speed with respect to operation of a replacing circuit. Particularly, in case deterioration of a data retention characteristic is caused by a simple leak phenomenon as seen in a DRAM, it is thought that relief of memories hardly brings disadvantages. This is because, such a leak phenomenon occurs at the level of atoms and the relief is not performed in order to improve a poor quality of the whole device. That is to say, the data retention time is not shortened due to the fact that the state of formation of a device or a circuit is physically defective but is simply shortened in data retention time at a level whether or not one atom is placed in a diffused layer. Therefore, it is sufficiently meaningful to thoroughly relieve a great number of cells by replacing defective bit cells bit by bit. Also, in a flash memory, a leak phenomenon may sometimes occur at a similar level. In such case, when performing a memory relief in a flash memory, it is thought that the constitution as shown in FIG. 7 is preferable.

Also, there is a cache memory accessing technique as a technique related to the present invention. While a cache memory is dynamic, the present invention is static. In the present invention, a map of defects is obtained by testing a chip having defects and writes the map into a nonvolatile memory. That is to say, it is the base of the present invention that so long as a chip is used the content of its map of defects is not changed. On the other hand, a cache memory is a technique of preparing a memory space to be used out of the whole memory space closely to a microprocessor, and the content of a map is changed on occasion. While a cache memory stores important (non-defective) cell information, the memory system of the present invention memorizes unnecessary (defective) cell information, and in this meaning both of them are essentially different techniques.

Summarizing the present invention in the following, a semiconductor memory device and a system using the same according to the present invention easily make it possible to relieve bit cells having, for example, poor data retention characteristic in a DRAM device by replacing them in bits. In the present invention, there is provided a memory cell array for bit relief data on-chip or off-chip in addition to a basic memory. Also, when turning power on, the present invention writes data from an on-chip or off-chip nonvolatile memory into the memory cell array. These data and input addresses are compared with each other by means of a set-associative method and if they hit each other, a bit replacement is performed. Here, to place an individual address at the index side or the TAG side is changed by changing the setting of an address converter depending on a device. It is preferable to refresh a replacement array more frequently than a normal array. Further, the efficiency is improved by storing additionally I/O information into the replacement data array. Also, an example of preferable embodiments of a system according to the present invention is to manufacture a flash memory for replacement data and a DRAM which is a basic memory as an MCP (multi-chip package). It is desirable to make high-speed a cell array for replacement by dividing the array into many parts.

In the above description, it is assumed that defective memory cells of the basic memory 110 are relieved by replacing them with memory cells of a memory cell array for relief However, there is a possibility that the memory cell array for relief itself includes defective memory cells. As mentioned above, the memory cell array for relief, i.e., the defective cell relieving memory, is tested in advance if it is non-defective. Therefore, by providing a redundancy circuit for the memory cell array for relief, it is possible to make the memory cell for relief non-defective. However, as mentioned above, in the memory system according to the present invention which uses the set-associative method, it is not the case that all the memory cells of the memory cell array for relief are used up. Therefore, if the defective portions of the memory cell array can be allocated to the portions not used, it is possible to avoid using the redundancy circuit for the memory cell array for relief, and to save an area of a memory chip.

Figures 15, 16:
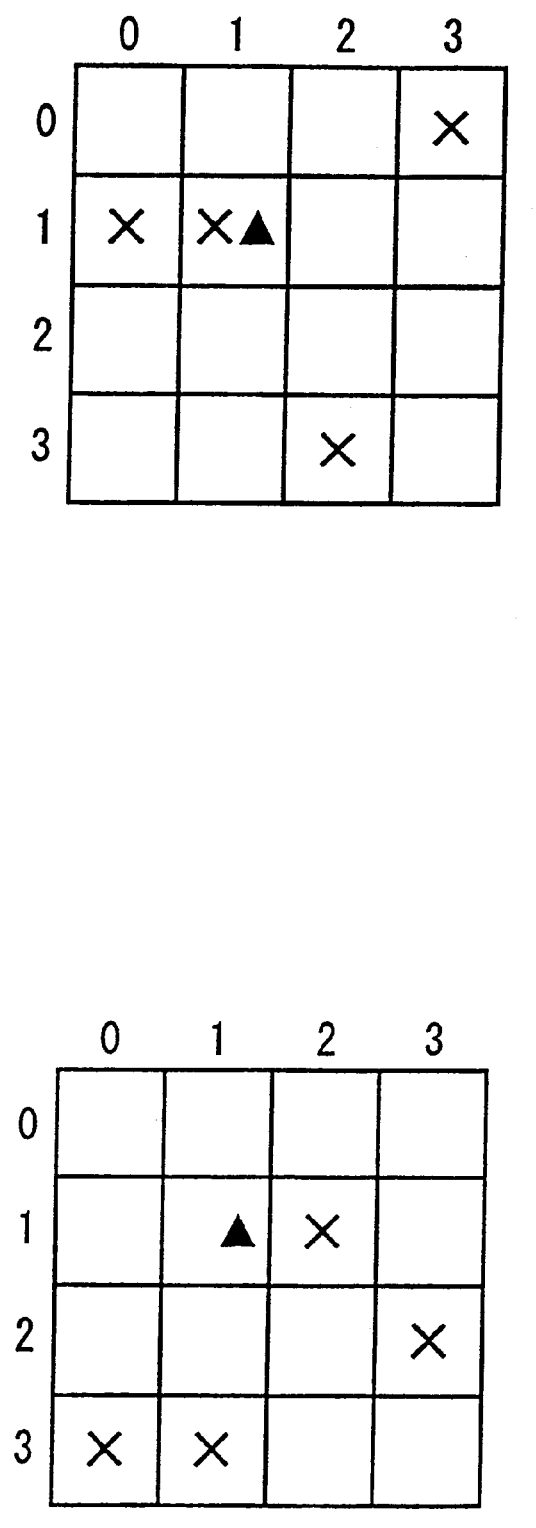

As an example, in the same condition as the case the address conversion is performed from the condition of FIG. 4 to the condition of FIG. 5, when, in an index address "11" of the memory cell array for relief, there is a defective cell indicated by a symbol "▼", address bits are replaced in the index address portion. Thereby, condition of allocation becomes from that shown in FIG. 15 to that shown in FIG. 16. That is, the address "11" is converted to an address "13". When the address conversion method (rule) is determined, if the defective portions of the memory cell array for relief are known, it is possible to avoid using the defective portions of the memory cell array for relief.

Figures 17, 18:
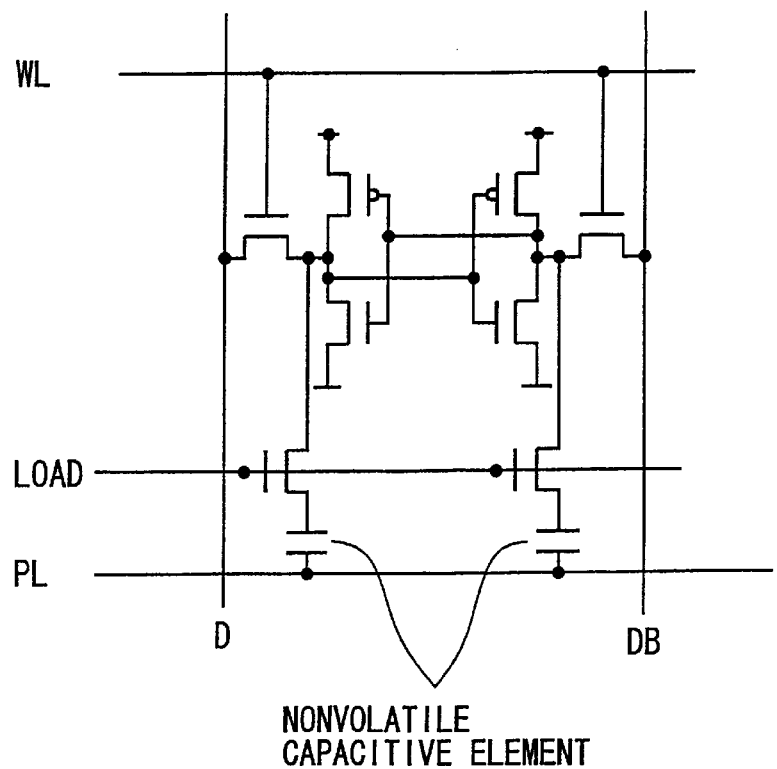
FIG. 17 is a explanatory diagram showing another example of data structure including a combination of an input/output information and a usage flag.
FIG. 18 is a circuit diagram showing an example of a structure of a memory cell in which nonvolatile capacitive elements are combined with a SRAM cell.

In the present invention, data area not used in the memory cell array for relief is indicated by the usage flags one of which is shown, for example, in FIG. 3A. Also, a configuration number of an input/output portion, that is, a bit number among output pins, is stored as the I/O information shown in FIG. 1, or as a part of the sector address shown in FIG. 3A. A burst order or an address of a memory cell is usually a multiple of 2. However, the configuration number of an input/output portion sometimes becomes a multiple of 9, that is, 9, 18, 36, . . . , because parity bit or bits are added thereto. In such case, in place of using an independent one bit as a usage flag, it is possible to indicate the usage flag and the bits of the configuration number of an input/output portion as combined information as shown in FIG. 17, and, thereby, to save a capacity of the memory cell array for relief.

Also, recently, as a non-volatile memory device, a ferroelectric memory is noticed. One type of the feroelectric memory device is a ferroelectric RAM (FeRAM) device having a memory cell shown in FIG. 18, which memory cell is a combination of ferroelectric capacitors and a SRAM cell. Such FeRAM can be used in the present invention, in place of a combination of a non-volatile memory, e.g., a flash memory, and a SRAM, or in place of a SRAM. An area of a memory cell of the FeRAM device becomes larger than a memory cell of the SRAM device. However, in case of an embodiment of the present invention in which almost all data of the SRAM device is loaded from the non-volatile memory, there is a possibility that the area of the memory array having memory cells each constituted of a combination of the ferroelectric capacitiors and a SRAM cell is smaller than the sum of the area of the flash memory and the area of the SRAM. In order to attain such advantageous effect, it is preferable to use a memory cell shown in FIG. 1 of International Electron Device Meeting (IEDM) Technical Digest, Amanuma, et al., 1998, pp. 363–366. This memory cell is manufactured by stacking a ferroelectric capacitor on a transistor layer. In this memory cell, during a time period in which LOAD signal (FIG. 18) is high, data is transferred between the ferroelectric capacitors and the SRAM cell.

When, in a semiconductor memory system according to the present invention, one or more basic memories and other circuits such as a relief memory, a relief detection circuit and a nonvolatile memory are constituted as separate chips, there is a possibility that the basic memory chips and a chip including other circuits are manufactured by different manufacturers. In such case, it is necessary to precisely inform property information of the basic memory chips to a memory system manufacturer. The property information of a basic memory chip is, for example, addresses of memory cells having poor data retention characteristic in the basic memory chip.

In this case, it is preferable that the property information of each basic memory, including information showing degree of shortage or deficiency of data retention time, is disclosed to the memory system manufacturer. This is because, there is an equipment or circuit in which a memory system having poor data retention characteristic can be used.

It is possible to relate these property information to a serial number added to each of the basic memories. It is possible to print the serial number on the package of the device of the basic memory, or to store the serial number in the basic memory and make it readable from therefrom in a particular operating mode.

Figure 19A:
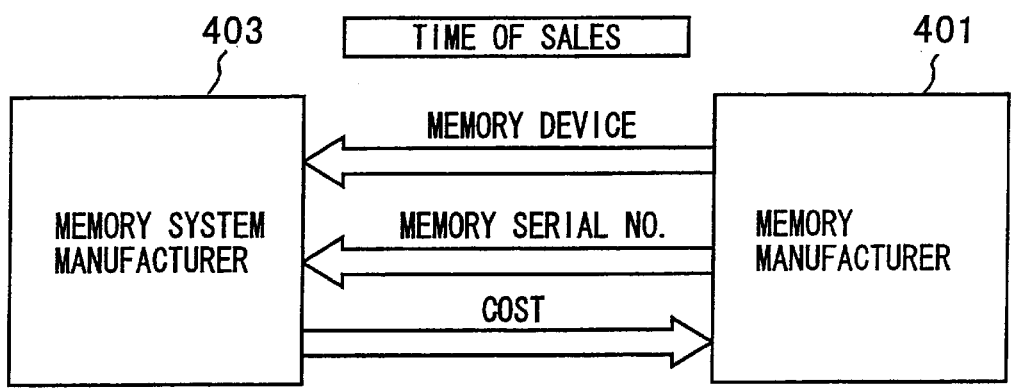
FIGS. 19A and 19B are explanatory diagrams illustrating a method of selling memory devices and providing memory property information.
Figure 19B:
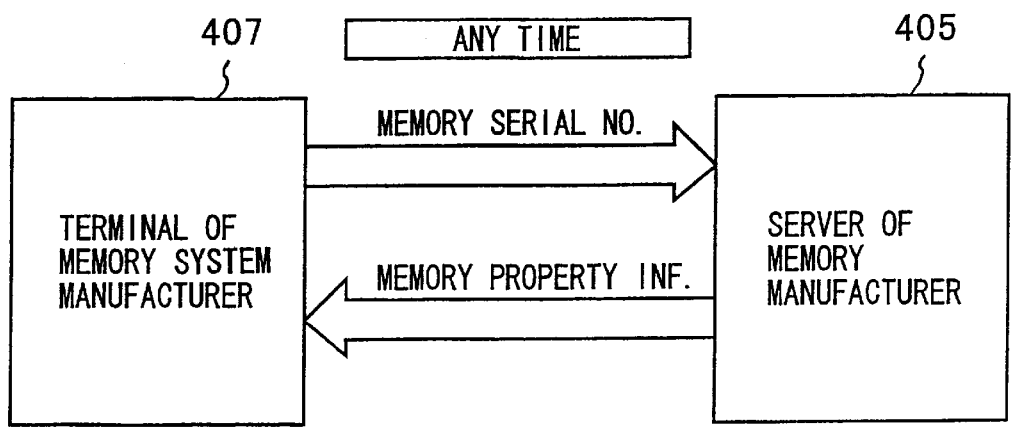

Also, it is also preferable that, in order to avoid loss of these property information, these property information can be obtained from a data base of the manufacturer of the basic memory over the Internet. As shown in FIG. 19A, when a manufacturer 401 of basic memory devices sells the basic memory devices to a memory system manufacturer 403, the manufacturer 401 of the basic memory devices also informs memory serial numbers of the basic memory devices to the memory system manufacturer 403. After obtaining the basic memory devices, the memory system manufacturer 403 access a server 405 of the manufacturer of the basic memory device from a terminal 407 of the memory system manufacturer. The memory system manufacturer 403 gives a serial number of a basic memory device to a server 405 of the manufacturer of the basic memory device from a terminal 407 of the memory system manufacture, and receives memory property information therefrom.

Simulation Results

Figure 20:
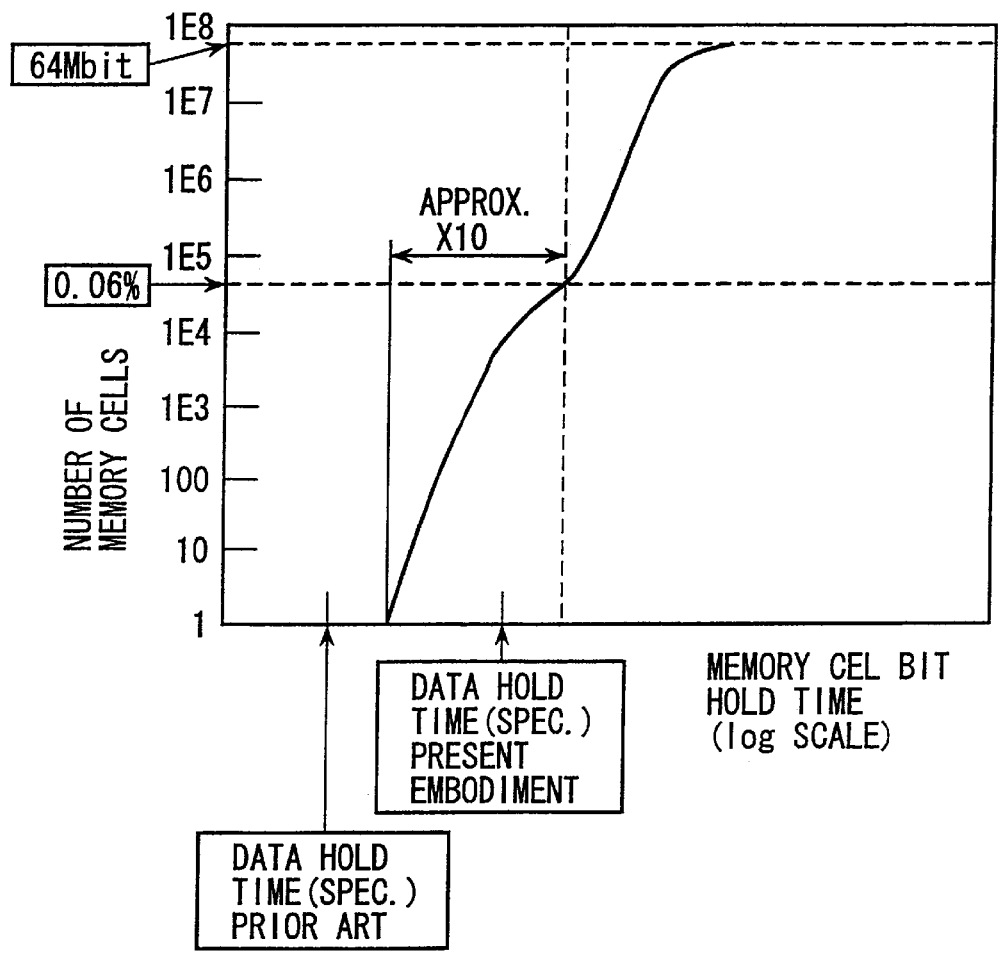
FIG. 20 is a view illustrating a result of simulation showing an effect of improving a data retention time according to the present invention.

With respect to the advantageous effects of the embodiment of the present invention shown in FIG. 1, an explanation will be made on a result obtained by comparing the invention with the prior art by means of simulation. FIG. 20 shows the data retention time of each bit cell of a DRAM memory cell (64 Mbits). The axis of ordinates represents the number of memory cells in logarithmic scale, and the axis of abscissas represents time in logarithmic scale. This figure shows distribution of the respective data retention times of 64 mega cells, and shows that the data retention time can be made about 10 times longer by relieving memory cells of 0.06 percent (%) in the whole memory, in comparison with a case no relief is performed. This figure shows positions of practical specifications (lower limit of the specifications) of the data retention time in a conventional example and the present invention. That is to say, the data retention times are marked at the positions having the same margin in the prior art and the present invention. The example of 0.06 percent is an example and this value is varied depending upon chips.

FIG. 21 is a diagram showing a result of comparing with each other magnitudes of data retention currents and comparing with each other refreshing intervals, in case memory cells having poor data retention characteristic are relieved according to the embodiment shown in FIG. 1 and in case of a conventional example (in case no relief is performed). A data retention time obtained by the embodiment of the present invention has been made about ten times longer in comparison with that of the conventional example. The fact that the data retention time is made longer means that the interval between refreshing operations is made longer. Since the refreshing operation of a DRAM consumes a comparatively large current, a long interval of refreshing can reduce the current and the data retention current is reduced greatly as shown in FIG. 21. In this case, since an electric current other than the refreshing current also flows, even if the data retention time is made ten times longer, the whole current is not made 1/10. However, since the whole current is made about 1/6 to 1/7, it is understood that this embodiment can be preferably applied to, for example, a portable equipment.

Figure 22:
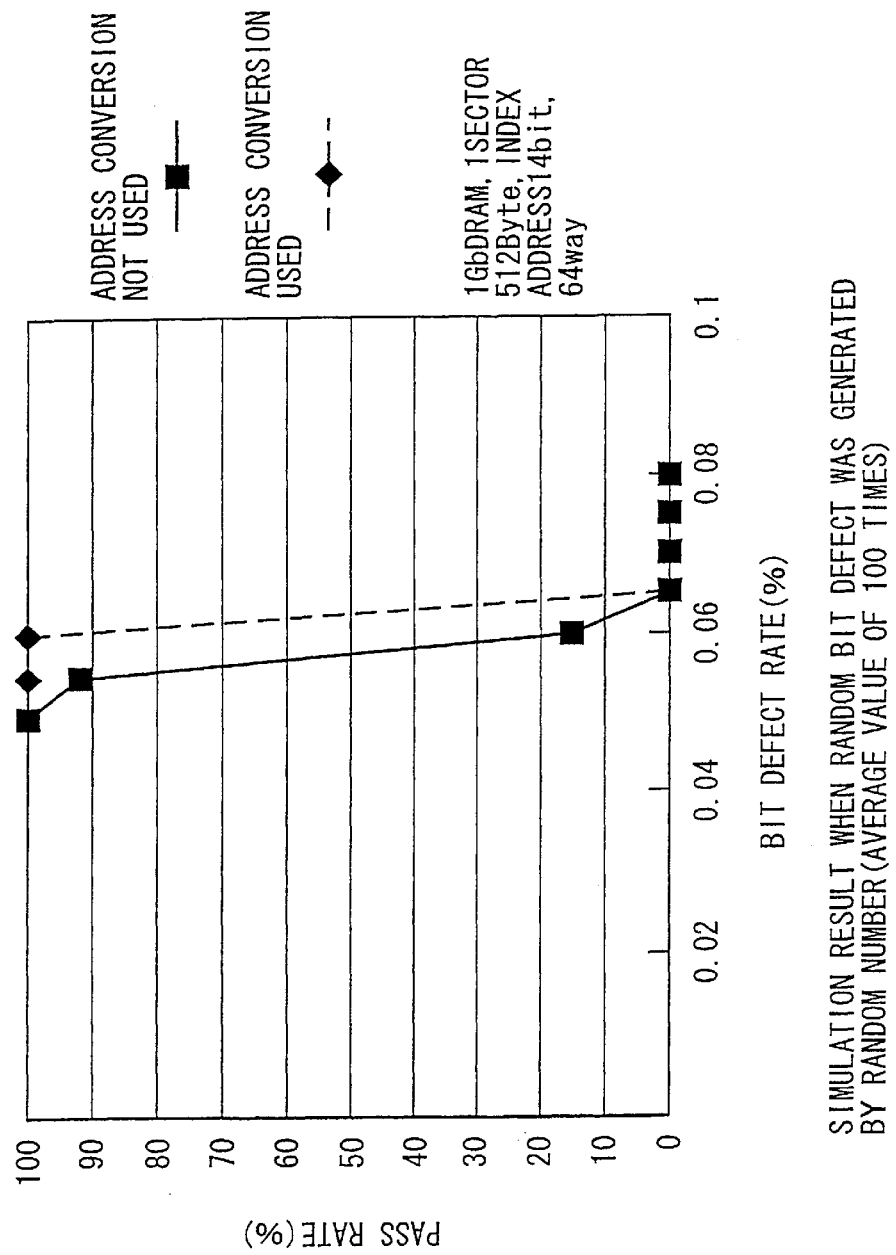
FIG. 22 is a view illustrating a result of simulation showing an effect of improving the rate of non-defectives by an address conversion according to the present invention.
Figure 23:
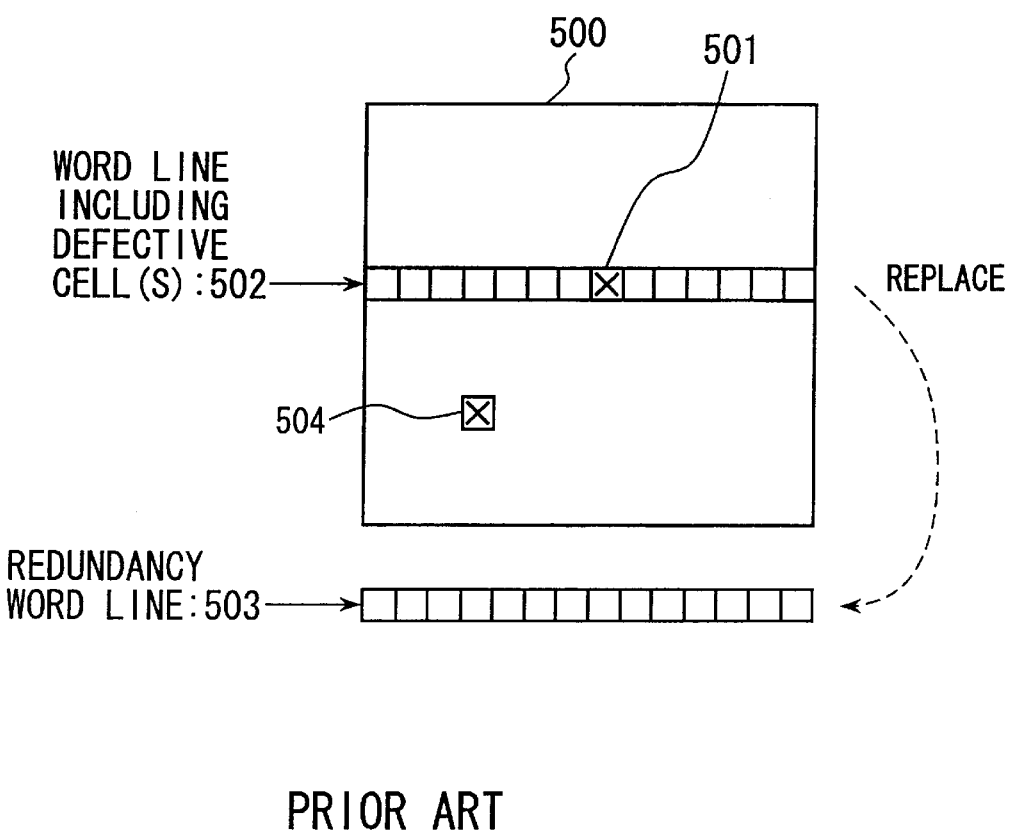
FIG. 23 is an explanatory diagram for explaining a memory cell relieving method according to the prior art.
Figure 24:
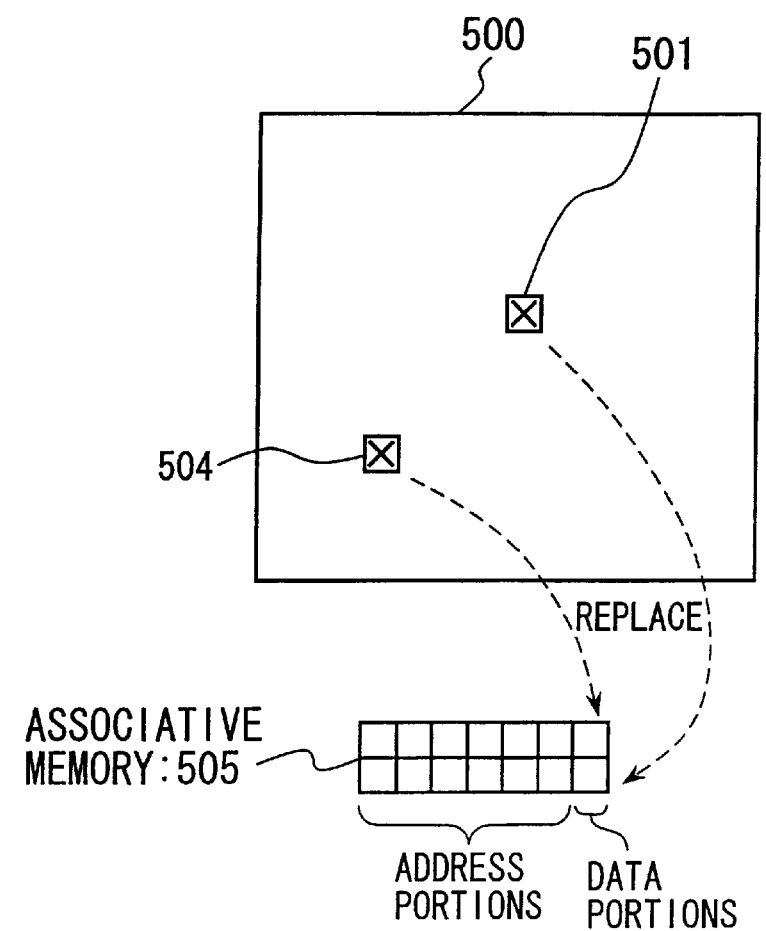
FIG. 24 is an explanatory diagram for explaining a memory cell relieving method using an associative memory according to the prior art.
Figure 25:
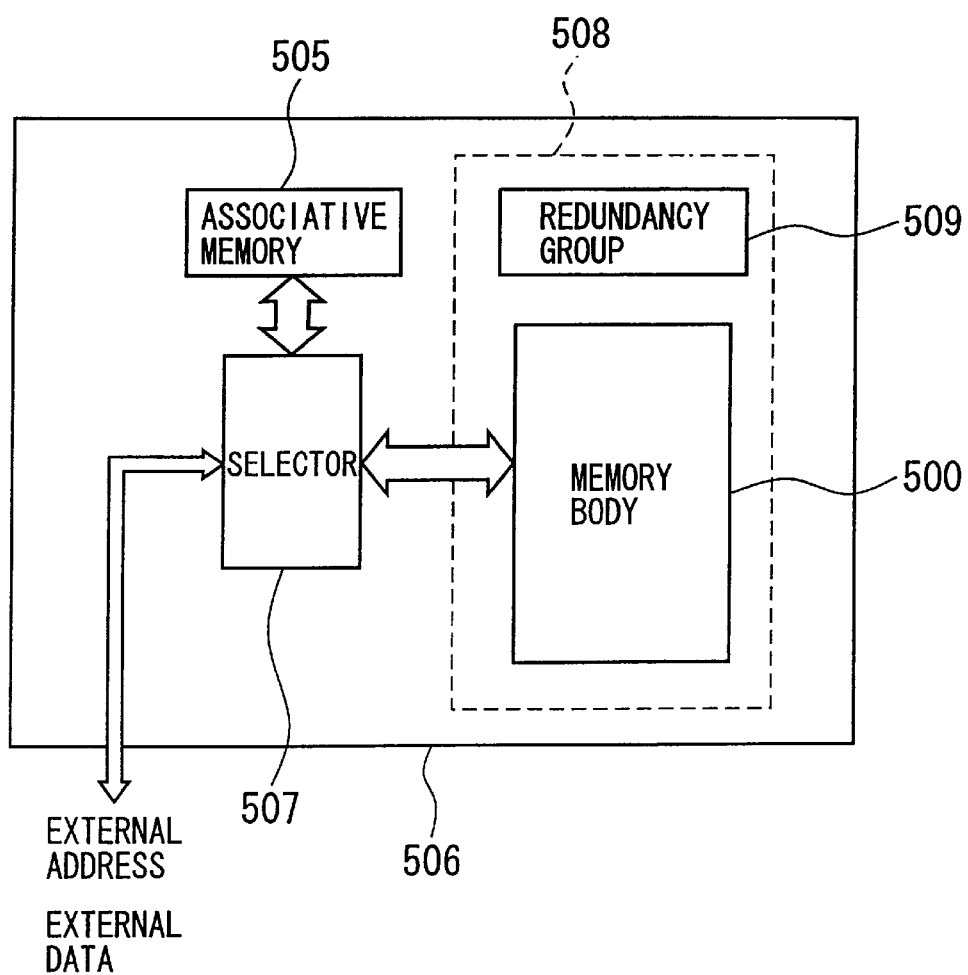
FIG. 25 is a block diagram showing a structure of a semiconductor memory device in case a memory cell relieving method using an associative memory according to the prior art is adopted.

FIG. 22 is a diagram showing a result of simulation for examining whether or not there is some difference in number of defective bit cells which are relievable, between a case an address conversion by means of the address converter 203 shown in FIG. 1 and the like is performed and a case an address conversion is not performed. The axis of ordinates represents the rate (%) of non-defective cells after relief by bit replacement, and the axis of abscissas represents the rate (%) of bit defectives of a basic memory. The result of simulation has been obtained by taking the average of 100 non-defective rates each of which is obtained by applying bit replacement to defective cells generated at random by means of random numbers on the assumption that a basic memory is a DRAM of 1 Gbit, one sector is of 512 bytes, an index address is of 14 bits, and a replacement array is of 64 ways. The difference between a case an address conversion is performed and a case an address conversion is not performed is as shown in FIG. 22. From FIG. 22, an effect has been confirmed that, when defective cells of 0.06% are generated, a non-defective rate of 15% (in case an address conversion is not performed) has been improved to a non-defective rate of 100% (in case an address conversion is performed).

Since a semiconductor memory device according to the present invention has made it possible to replace memory cells in bits by means of a set-associative method by comprising: a memory cell array for relief which stores plural pieces of information for identifying bit cells to be replaced and provides memory cells for replacing in bits arbitrary memory cells existing in a basic memory according to these pieces of information; an address converter for allocating address signals to be supplied to the basic memory to an index portion and a tag portion; a decoder for decoding the index portion allocated by the address converter, a comparator for comparing the tag portion allocated by the address converter with information specified by an output of the decoder out of information for identifying bit cells to be replaced, said information for identifying bit cells to be replaced being stored in the memory cell array for relief, and a selector for selecting and connecting either of memory cells in the basic memory and memory cells in the memory cell array to the outside on the basis of output of the comparator. Therefore, the semiconductor memory device can provide spare memories capable of replacing in bits a larger number of memory cells in comparison with the prior art, and can easily improve the data data retention characteristic of a DRAM device and the like.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor memory device comprising:

a memory cell array for relief which stores plural pieces of information for identifying bit cells to be replaced and provides memory cells for replacing in bits arbitrary memory cells existing in a basic memory according to these pieces of information;

a decoder for allocating address signals be supplied to the basic memory to an index portion and a tag portion and for decoding an address allocated to the index portion;

a comparator for comparing an address allocated to the tag portion with information specified by an output of the decoder out of information for identifying bit cells to be replaced, said information for identifying bit cells to be replaced being stored in the memory cell array for relief; and a selector for selecting and connecting either of memory cells in the basic memory and memory cells in the memory cell array for relief with the outside on the basis of an output of the comparator.

2. A semiconductor memory device as set forth in claim 1, wherein said basic memory is disposed on the same chip where said memory cell array for relief is disposed.

3. A semiconductor memory device as set forth in claim 1, wherein the information for identifying said bit cells to be replaced is written into said memory cell array for relief from a nonvolatile memory when turning on power of said semiconductor memory device.

4. A semiconductor memory device as set forth in claim 3, wherein said basic memory and said nonvolatile memory are disposed on the same chip where said memory cell array for relief is disposed.

5. A semiconductor memory device as set forth in claim 3, wherein the information for identifying said bit cells to be replaced which is stored in said nonvolatile memory are data corresponding to bit cells having poor data retention characteristic in the basic memory composed of a DRAM.

6. A semiconductor memory device as set forth in claim 3, wherein at least one of said basic memory and said nonvolatile memory is disposed outside a chip of said semiconductor memory device.

7. A semiconductor memory device as set forth in claim 1, further comprising an address converter as a circuit means for allocating address signals to be supplied to said basic memory to the index portion and the tag portion, wherein said address converter performs an address conversion including rearrangement of address signals on the basis of the information stored in a nonvolatile memory, when allocating the address signals to be supplied to the basic memory to the index portion and the tag portion.

8. A semiconductor memory device as set forth in claim 7, wherein said information for rearrangement of address signals is the information stored in said nonvolatile memory on the basis of a result of an operation test of the basic memory.

9. A semiconductor memory device as set forth in claim 7, wherein said nonvolatile memory storing the information for rearrangement of address signals and a nonvolatile memory for storing information for identifying said bit cells to be replaced are disposed on the same chip.

10. A semiconductor memory device as set forth in claim 7, wherein said address conversion is performed so as to avoid using defective portions of said memory cell array for relief.

11. A semiconductor memory device as set forth in claim 1, wherein said memory cell array for relief also stores flag information for indicating whether each of said plural pieces of information for identifying bit cells to be replaced is valid or not, in addition to storing said plural pieces of information for identifying bit cells to be replaced.

12. A semiconductor memory device as set forth in claim 11, wherein said flag information is combined with said information for identifying bit cells to be replaced.

13. A semiconductor memory device as set forth in claim 1, wherein said basic memory and said memory cell array for relief are formed out of memories requiring a refreshing operation for retaining memory, and a refreshing operation is performed more frequently for said memory cell array for relief than for said basic memory.

14. A semiconductor memory device as set forth in claim 1, wherein said memory cell array for relief comprises a memory cell array which includes memory cells each having a combination of a SRAM cell and ferroelectric capacitor elements.

15. A semiconductor memory system comprising:

a basic memory portion;

a memory cell array for relief which stores plural pieces of information for identifying bit cells to be replaced and provides memory cells for replacing in bits arbitrary memory cells existing in said basic memory portion according to these pieces of information;

a nonvolatile memory for supplying said information for identifying bit cells to be replaced to said memory cell array for relief;

a decoder for allocating address signals be supplied to the basic memory portion to an index portion and a tag portion and for decoding an address allocated to the index portion;

a comparator for comparing an address allocated to the tag portion with information specified by an output of the decoder out of information for identifying bit cells to be replaced, said information for identifying bit cells to be replaced being stored in the memory cell array for relief; and a selector for selecting and connecting either of memory cells in the basic memory portion and memory cells in the memory cell array for relief with the outside on the basis of an output of the comparator.

16. A semiconductor memory system as set forth in claim 15, wherein at least one of said basic memory portion and said nonvolatile memory is disposed outside a chip of other portion of said semiconductor memory system.

17. A semiconductor memory system as set forth in claim 15, wherein said basic memory portion comprises a plurality of memory chips.

18. A semiconductor memory system as set forth in claim 15, comprising, in place of said nonvolatile memory and said memory cell array for relief, a memory cell array which comprises memory cells each having a combination of a SRAM cell and ferroelectric capacitor elements.

* * * * *